(12) United States Patent
Watanabe et al.

(10) Patent No.: US 7,435,968 B2
(45) Date of Patent: Oct. 14, 2008

(54) RADIATION DETECTING APPARATUS, RADIATION IMAGING APPARATUS AND RADIATION IMAGING SYSTEM

(75) Inventors: Minoru Watanabe, Honjo (JP); Chiori Mochizuki, Sagamihara (JP); Keiichi Nomura, Honjo (JP); Takamasa Ishii, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 33 days.

(21) Appl. No.: 11/467,809

(22) Filed: Aug. 28, 2006

(65) Prior Publication Data

US 2007/0045556 A1 Mar. 1, 2007

(30) Foreign Application Priority Data

| | | |
|---|---|---|
| Aug. 31, 2005 | (JP) | 2005-251609 |
| Aug. 31, 2005 | (JP) | 2005-251610 |
| Aug. 24, 2006 | (JP) | 2006-227986 |

(51) Int. Cl.
*G01T 1/20* (2006.01)
*G01T 1/24* (2006.01)
*H01L 27/146* (2006.01)

(52) U.S. Cl. ............. 250/370.14; 250/370.09; 250/370.11; 257/E27.132; 257/E27.146

(58) Field of Classification Search ......... 250/370.09, 250/370.11, 370.14; 257/E27.132, E27.146
See application file for complete search history.

(56) References Cited

U.S. PATENT DOCUMENTS

| 7,205,547 B2 | 4/2007 | Ishii et al. ............ 250/370.09 |
|---|---|---|
| 7,205,568 B2 | 4/2007 | Watanabe et al. ............ 257/59 |
| 7,214,945 B2 | 5/2007 | Nomura et al. ........ 250/370.08 |
| 2003/0226974 A1 * | 12/2003 | Nomura et al. ........ 250/370.11 |
| 2006/0062352 A1 | 3/2006 | Nomura et al. ............ 378/98.8 |
| 2006/0065944 A1 | 3/2006 | Mochizuki et al. .......... 257/444 |
| 2006/0249763 A1 | 11/2006 | Mochizuki et al. .......... 257/291 |
| 2007/0069107 A1 | 3/2007 | Ishii et al. ............... 250/208.1 |
| 2007/0131867 A1 | 6/2007 | Okada et al. ........... 250/370.09 |
| 2007/0145285 A1 | 6/2007 | Ishii et al. ............ 250/370.11 |
| 2007/0146520 A1 | 6/2007 | Watanabe et al. .......... 348/308 |

FOREIGN PATENT DOCUMENTS

| JP | 2003-255051 | 9/2003 |
|---|---|---|
| JP | 2004-15002 | 1/2004 |
| JP | 2004-179645 | 6/2004 |

\* cited by examiner

*Primary Examiner*—David P. Porta
*Assistant Examiner*—Faye Boosalis
(74) *Attorney, Agent, or Firm*—Fitzpatrick, Cella, Harper & Scinto

(57) ABSTRACT

A radiation detecting apparatus according to the present invention includes: pixels including switching elements arranged on an insulating substrate and conversion elements arranged on the switching elements to convert a radiation into electric carriers, the switching elements and the conversion elements are connected with each other, the pixels two-dimensionally arranged on the insulating substrate in a matrix; gate wiring commonly connected with a plurality of switching elements arranged in a row direction on the insulating substrate; signal wiring commonly connected with a plurality of switching elements arranged in a column direction; and a plurality of insulating films arranged between the switching elements and the conversion elements, wherein at least one of the gate wiring and the signal wiring is arranged to be put between the plurality of insulating films.

16 Claims, 26 Drawing Sheets

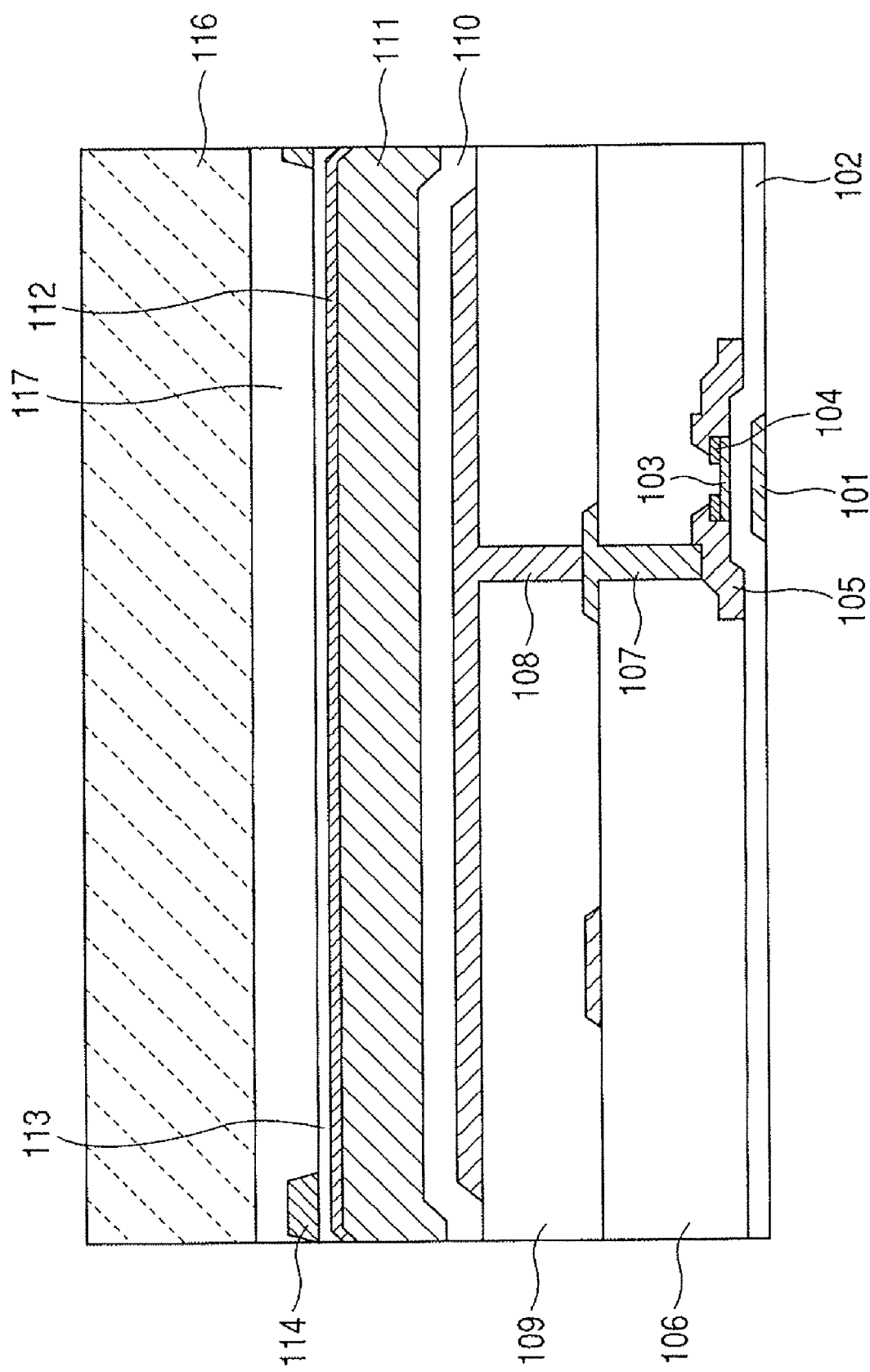

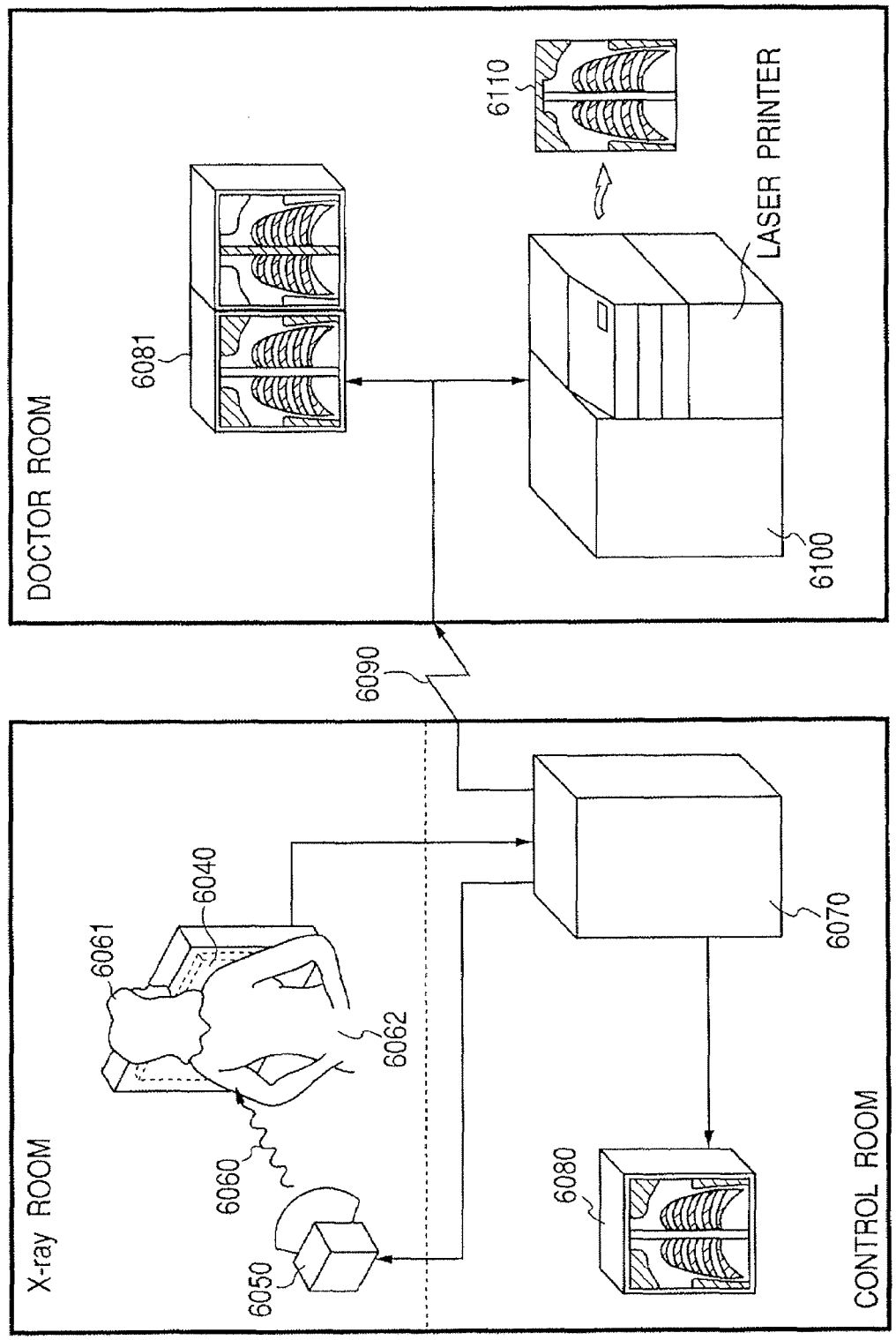

RADIATION DETECTING APPARATUS, RADIATION IMAGING APPARATUS AND RADIATION IMAGING SYSTEM

BACKGROUND OF THE INVENTION

1. Field of the Invention

The present invention relates to a radiation detecting apparatus including a conversion element converting a radiation or a light into electric carriers, and a thin film transistor (TFT) being a switching element in a pixel.

The radiation detecting apparatus is especially suitably used for a radiation detecting apparatus detecting a radiation, and is used for a medical diagnostic apparatus, a nondestructive inspection apparatus, an analysis apparatus using a radiation, and the like. Hereupon, in the present specification, it is supposed that visible light or like, not only an α-ray, a β-ray, a γ-ray and the like, which are beams produced by particles (including photons) emitted by radioactive decay, but also beams having the energy of the same degree of intensity as those of the particles such as an X-ray, a corpuscular ray, a cosmic ray and the like are included in a radiation.

2. Description of the Related Art

Recently, enlargement in size of a TFT matrix panel, in which are formed on an insulating substrate, and the speeding up of the drive speed of the TFT matrix panel have been being rapidly advanced. The manufacturing techniques of a liquid crystal panel using are used for an area sensor (for instance, a radiation detecting apparatus) including semiconductor conversion elements each converting a radiation such as an X-ray into an electric signal. As such a semiconductor conversion element, for instance, there are a semiconductor conversion element arranging an wavelength converting layer (for instance, a phosphor layer) performing the wavelength conversion from a radiation such as an X-ray into a light such as a visible light on the surface of the semiconductor conversion element to perform the photoelectric conversion of the light, a semiconductor conversion element using a semiconductor converting material performing direct conversion of a radiation into an electric signal, and the like.

On a substrate arranging thereon such semiconductor conversion elements and TFTs for reading the electric signals from the semiconductor conversion elements two-dimensionally to read a quantity of radiation irradiation, the quantity of the radiation irradiated to each pixel or the quantity of the light converted from the radiation are detected. Although it is possible to provide a highly sensitive radiation detecting apparatus by detecting the quantities more, it is necessary for the sake that the semiconductor conversion elements are arranged by using the whole space effectively while the performances of the TFTs are kept.

Accordingly, in prior art, there has been a proposal in which, after a TFT array has been formed, the semiconductor conversion elements are laminated on the TFT array to prevent the losses of the aperture ratios by the TFTs and to improve sensitivity. As an example thereof, Japanese Patent Application Laid-Open No. 2004-15002 describes that semiconductor conversion elements are arranged above TFTs.

A planarization layer is formed on the source electrode and the drain electrode of a TFT, and a semiconductor conversion element is formed above the planarization layer. The provision of the planarization layer reduces the capacitive coupling between the TFT and the semiconductor conversion element, and consequently it becomes possible to form the semiconductor conversion element on the TFT and each wiring. By adopting such a configuration, the aperture ratio of the semiconductor conversion element is improved.

SUMMARY OF THE INVENTION

However, because radiographing is performed in a region in which the quantity of irradiation of a radiation is very small with, for example, the moving image radiographing sensor of a radiation detecting apparatus, it is necessary to read a minute signal from the semiconductor conversion element accurately. Then, it becomes necessary to raise the S/N ratio of the radiation detecting apparatus furthermore. It has been enabled by using, for instance, the planarization layer and by providing a semiconductor conversion element on the planarization layer to enlarge the aperture ratio of the semiconductor conversion element and to heighten the sensitivity of the semiconductor conversion element. Accordingly it is necessary to reduce noises more for improving the S/N ratio furthermore. For the sake, it is required to reduce the capacities of signal wiring and gate wiring.

The present invention is directed to improve sensitivity and to reduce noises by reducing the parasitic capacity between signal wiring and gate wiring in a radiation detecting apparatus two-dimensionally arranging pixels each composed of a couple of a conversion element converting a radiation not including a light or a light into electric carriers and a switching element. Furthermore, the present invention aims the improvement of the sensitivity and the reduction of noises by reducing the parasitic capacity between a conversion element and wiring. Moreover, the present invention provides a high S/N ratio converting device capable of acquiring a good image even if the level of an incident radiation or an incident light is low in the case of a high speed radiographing of moving image performing a high speed drive.

To solve the above-mentioned problems, a radiation detection apparatus according to the present invention includes: pixels including switching elements arranged on an insulating substrate and conversion elements arranged above the switching elements to convert a radiation into electric carriers, wherein the switching elements and the conversion elements are connected with each other, the pixels are arranged two-dimensionally on the insulating substrate in a matrix; gate wiring commonly connected with each of switching elements arranged in a row direction on the insulating substrate; signal wiring commonly connected with each of switching elements arranged in a column direction; and a plurality of insulating films arranged between the switching elements and the conversion elementS, wherein at least one of the gate wiring and the signal wiring is arranged to be put between the plurality of insulating films.

According to the present invention, one of a signal wiring and a gate wiring is arranged between two insulating layers, thereby providing a radiation detecting apparatus of reduced wiring capacitance, reduced arch fact and reduced noise. Accordingly, even in case of large number of the signal wirings and the gate wirings which are driven simultaneously, large number of signals can be are read out simultaneously. As a result, at a time of processing of high speed moving image, even in case of low level dosage incident radiation such as low radiation dosage range, an accurate image information can be derived at an imaging.

In addition, in the present specification, the conversion element converting a radiation into electric carriers means an element receiving a light such as a visible light, an infrared light and the like and a radiation such as an X-ray, an α-ray, a β-ray, a γ-ray and the like to convert the received light and the received radiation into electric carriers. The conversion element includes a photoelectric conversion element converting the light such as the visible light, the infrared light and the like into the electric carriers, and an element made of amorphous selenium or the like as a semiconductor layer to directly convert the radiation such as the X-ray and the like into the electric carriers.

Other features and advantages of the present invention will be apparent from the following description taken in conjunction with the accompanying drawings, in which like reference characters designate the same or similar parts throughout the Figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 22 is a sectional view taken along a line 22-22 line in FIG. 16.

FIG. 24 is a view showing an application example of a radiation imaging apparatus according to the present invention to a radiation imaging system.

DESCRIPTION OF THE EMBODIMENTS

In the following, the preferred embodiments of the present invention will be described with reference to the attached drawings. Although the following embodiments will be described with regard to the cases of constituting a radiation detecting apparatus, the radiation detecting apparatus of the present invention is not limited to the radiation detecting apparatus converting a radiation such as a X-ray, an α-ray, a γ-ray and the like into electric carriers, but can be also applied as a photoelectric conversion apparatus converting a light such as a visible light, an infrared light and the like into an electric signal. In addition, the radiation imaging apparatus is an apparatus including a sensor substrate and peripheral circuitry, which can be grasped as a radiation detecting apparatus.

First Embodiment

First, a first embodiment of the present invention is described.

Figure 1:
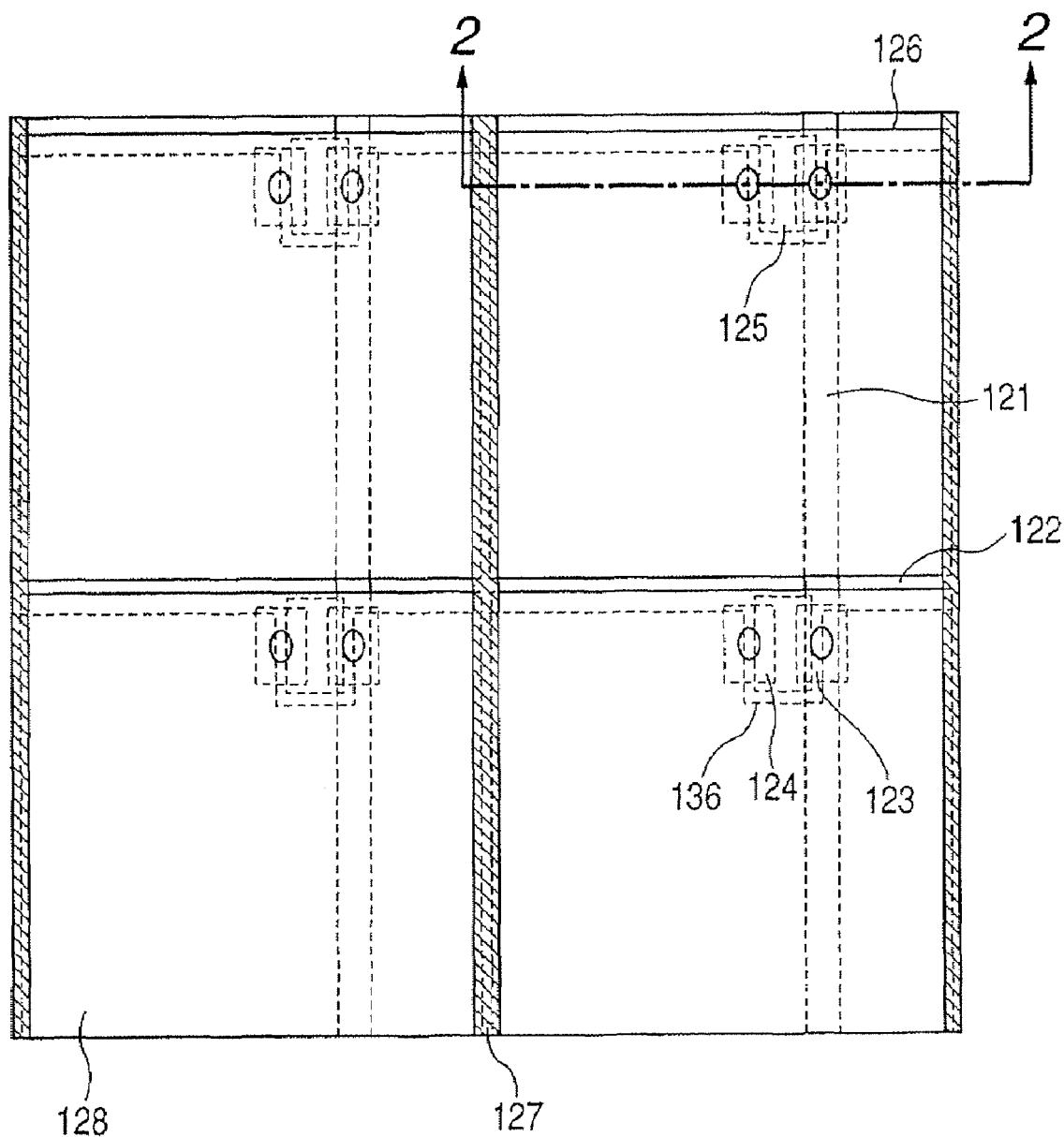
FIG. 1 is a plan view showing pixels of a radiation detecting apparatus according to a first embodiment of the present invention.
Figure 2:
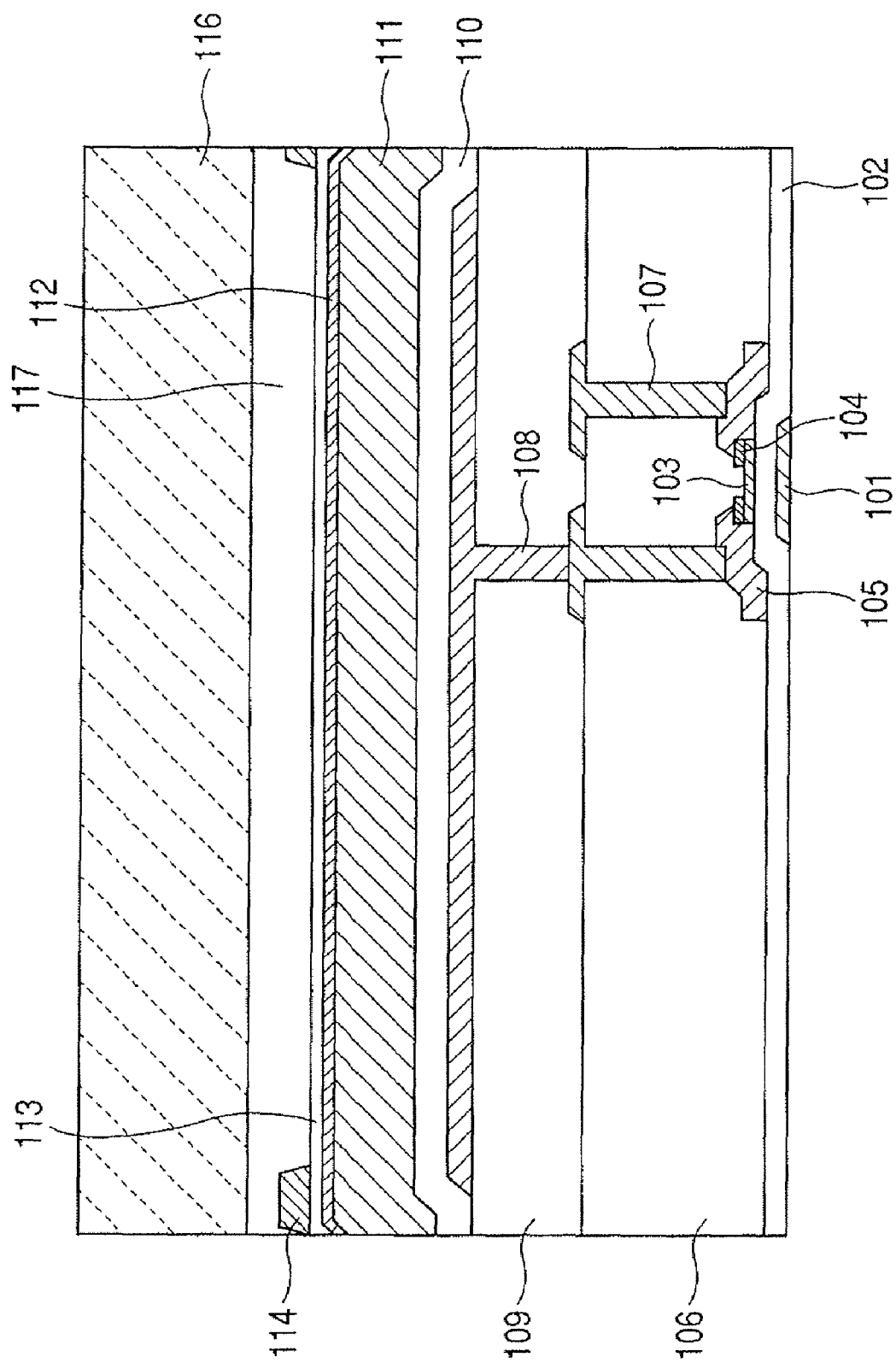
FIG. 2 is a sectional view taken along a line 2-2 in FIG. 1.
Figure 3:
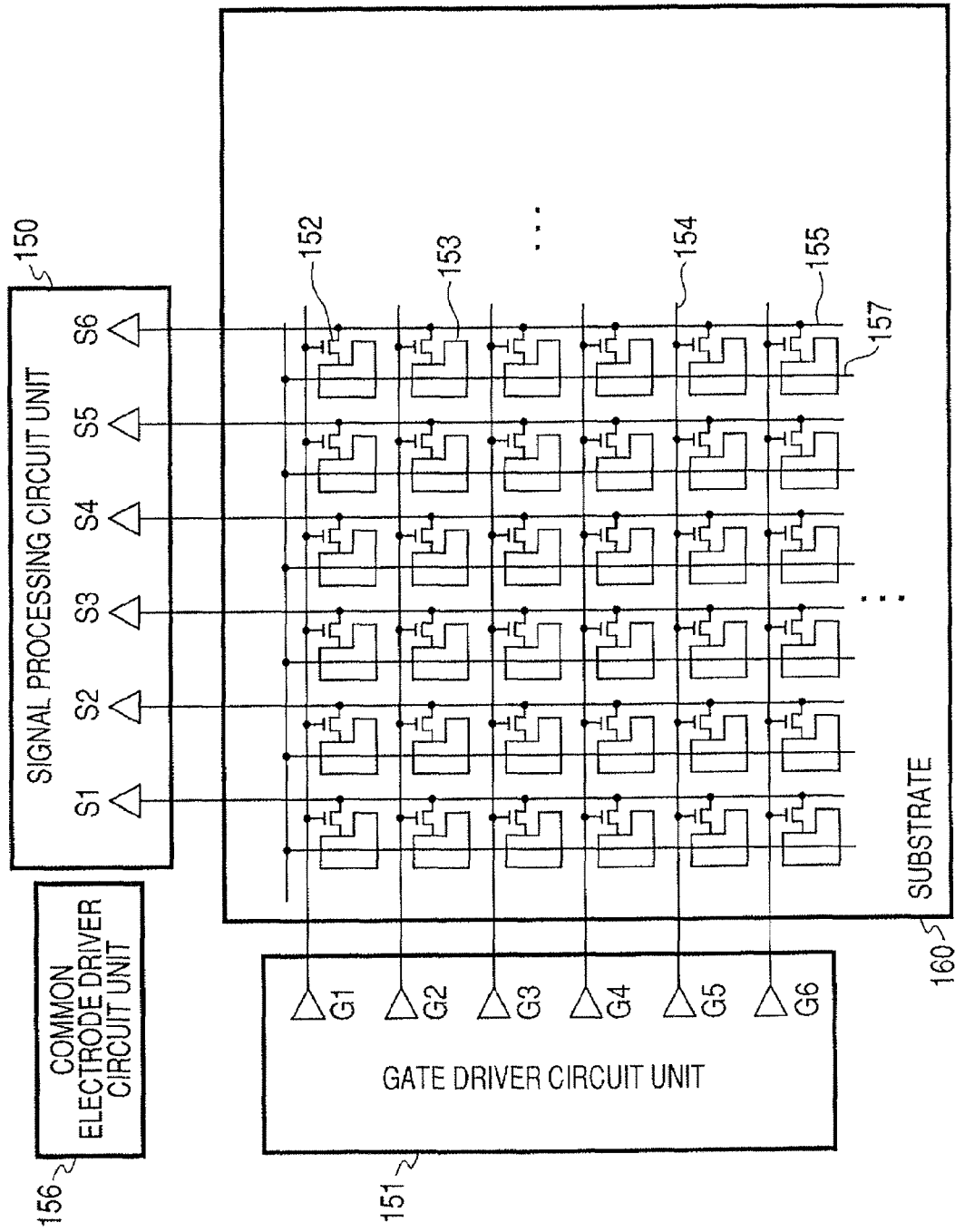
FIG. 3 is a simplified equivalent circuit diagram of a radiation imaging apparatus according to the first embodiment of the present invention.

FIGS. 1 to 3 are a plan view and a sectional view of pixels of a radiation detecting apparatus, and a simplified equivalent circuit diagram of a radiation imaging apparatus according to the first embodiment of the present invention, respectively.

The gist of the present embodiment is that a plurality of insulating films are arranged between switching elements and conversion elements, and that at least one of gate wiring and signal wiring is arranged in a region put between the insulating films. Moreover, the respect is common to all the embodiments.

FIG. 1 is a plan view of pixels of the radiation detecting apparatus according to the first embodiment of the present invention.

FIG. 1 is a plan layout view showing a pixel part composed of two rows by two columns of an effective pixel region where the pixels, each including a couple of a conversion element converting an radiation into an electric signal (electric carriers) and a switching element, are arranged in a matrix on an insulating substrate.

The conversion element of the present embodiment is a semiconductor conversion element made of, for example, hydrogenated amorphous silicon, which converts a light such as a visible light, an infrared light and the like, and a radiation such as an X-ray, a γ-ray and the like into electric carriers. For example, when a photoelectric conversion element, which converts a light such as a visible light and the like into an electric signal but does not directly convert any radiations such as an X-ray and the like, is used as the semiconductor conversion element, a phosphor layer as a wavelength converting layer (scintillator) converting a radiation into a light such as a visible light, which can be photoelectrically converted, is arranged on the photoelectric conversion element.

In FIG. 1, a TFT, which is a switching element, has three electrodes of a one electrode 123 (source electrode), an another electrode 124 (drain electrode) and a gate electrode 136. Signal wiring 121 connected to a signal processing circuit unit performing the read processing of accumulated electric carriers is connected with the source electrode 123 of the TFT. Moreover, gate wiring 122 connected with a gate driver circuit unit controlling the turning on or the turning off of the TFT is connected with the gate electrode 136 of the TFT. A channel portion 125 of the TFT exists between the source electrode 123 and the drain electrode 124, and the flowing or the stopping of electric carriers through the channel portion 125 can be controlled by controlling the voltage of the gate electrode 136.

The gate wiring 122 is commonly connected with the TFTs of a plurality of pixels arranged in a row direction, and the signal wiring 121 is commonly connected with the TFTs of a plurality of pixels arranged in a column direction.

Here, the row direction and the column direction are expedient expressions based on the arrangement of a plurality of pixels in a two-dimensional matrix, and the viewpoint of the row and the column may be replaced. That is, the direction of the gate wiring 122 may be regarded as the column direction, and the direction of the signal wiring may be regarded as the row direction.

The semiconductor conversion element is composed of a lower electrode 126, a light receiving region 128 and a bias wiring 127, and is arranged on the top surface of the TFT. The lower electrode 126 is connected with the drain electrode 124 through a through-hole.

The signal wiring 121 is arranged under the lower electrode 126, and is connected with the source electrode 123 arranged at the further lower part to the signal wiring 121 through a through-hole. However, the lower electrode 126 of the semiconductor conversion element and the signal wiring 121 do not necessarily two-dimensionally overlap with each other as shown in FIG. 1, but they may be arranged not to overlap each other as the need arises. The signal wiring 121 is arranged in the form of being put between an insulating film arranged under the lower electrode 126 and an insulating film covering the TFT portion composed of the source electrode, the drain electrode and the like.

FIG. 2 is a sectional view taken along a line 2-2 in FIG. 1. The upper part thereof shows a semiconductor conversion element, and the lower part thereof shows a TFT. FIG. 2 shows an example of arranging the wiring in a region put between a $1^{st}$ insulating film and a $2^{nd}$ insulating film above a source electrode or a drain electrode in order to reduce the capacity of the signal wiring.

The semiconductor conversion element in the upper part is an MIS type semiconductor conversion element composed of a $4^{th}$ metal layer 108, an insulating film 110 of the semiconductor conversion element, a $2^{nd}$ high resistance semiconductor layer 111, a $2^{nd}$ impurity semiconductor layer 112, which is an ohmic contract layer, and a transparent electrode layer 113. The semiconductor conversion element can perform the photoelectric conversion of a light such as a visible light and the like. The TFT in the lower part is composed of the following components: a $1^{st}$ metal layer 101 arranged on the insulating substrate, a gate insulating film 102 arranged over the $1^{st}$ metal layer 101, a $1^{st}$ high resistance semiconductor layer 103 arranged over the gate insulating film 102, $1^{st}$ impurity semiconductor layers 104 arranged over the $1^{st}$ high resistance semiconductor layer 103, and $2^{nd}$ metal layers 105 arranged over the $1^{st}$ impurity semiconductor layers 104. A $1^{st}$ insulating film 106 and a $2^{nd}$ insulating film 109 are arranged between the TFT portion and the semiconductor conversion element, and $3^{rd}$ metal layers 107 are arranged over the $2^{nd}$ metal layers 105. A phosphor layer 116 is arranged over a protection layer 117.

The transparent electrode layer 113 made of, for instance, ITO or the like is arranged over the $2^{nd}$ impurity semiconductor layer 112. When the $2^{nd}$ impurity semiconductor layer 112 has low resistance, the $2^{nd}$ impurity semiconductor layer 112 can be also used as an electrode layer, and the transparent electrode layer 113 is unnecessary. $5^{th}$ metal layers 114 are bias wiring for applying a voltage to the transparent electrode layer 113, and is connected with a common electrode driver arranged on the outside of the substrate. Hereupon, although the $5^{th}$ metal layers 114 are arranged over the transparent electrode layer 113 to touch the electrode 113, the $5^{th}$ metal layers 114 may be arranged in the form of being covered by the transparent electrode layer 113. Moreover, the bias wiring may be arranged anywhere in the pixel. However, in the case of the semiconductor conversion element converting a radiation into a visible light to convert the visible light into electric carriers with the $2^{nd}$ high resistance semiconductor layer 111, the light can be received by the whole surface of a region in which the electric carriers are easily collected by putting the bias wiring in the region where the $4^{th}$ metal layer 108, which is the lower electrode of the semiconductor conversion element, is not arranged. Consequently, the semiconductor conversion element is still more preferable.

The signal wiring 121 shown in FIG. 1 is formed of the $3^{rd}$ metal layers 107 in FIG. 2, and is arranged in a region put between the $1^{st}$ insulating film 106 and the $2^{nd}$ insulating film 109. Hereupon, when, for instance, a film having a thin film thickness and a high relative dielectric constant is used as the $1^{st}$ insulating film 106 or the $2^{nd}$ insulating film 109, the film forms a large capacity with the lower electrode of the semiconductor conversion element made of the $4^{th}$ metal layer arranged in the upper part. Furthermore, the film forms a large capacity with the gate wiring (not shown) connected to the gate electrode made of the $1^{st}$ metal layer 101 at the intersecting part with the gate wiring. Accordingly, it is preferable that the $1^{st}$ insulating film 106 and the $2^{nd}$ insulating film 109 are ones capable of being formed to have a thick film thickness and a low dielectric constant. In the present embodiment, an insulating film made of an organic material having a low relative dielectric constant is used. A material such as a polyimide resin, an acrylic resin or the like, which has a high heat resisting property, is preferable as the organic material. Moreover, the material having a relative dielectric constant within a range of from about 2.5 to about 4 is preferable. The film thickness of the insulating film made of the organic material is preferably 1 μm or more even in a region where the film thickness is thin. However, for instance, a silicon oxide film having a relative dielectric constant within a range of from about 3.5 to about 4.5 and a silicon nitride film, which has a relative dielectric constant within a range of from about 5.5 to about 7.5 and is excellent in an insulating property, which films have relatively low relative dielectric constants among inorganic materials, may be formed to be thick. Thereby, it becomes possible to reduce the capacity of the gate wiring intersecting with the signal wiring and the capacity of the semiconductor conversion element arranged in the upper part and the signal wiring.

At the same time, because the insulating film having the thickness of 1 μm or more and being made of, for instance, the organic material mentioned above is arranged in the intersecting part of the signal wiring and the gate wiring, the capacity can be greatly decreased. Furthermore, it is the signal wiring 121 that is arranged in the region put between the $1^{st}$ insulating film 106 and the $2^{nd}$ insulating film 109. Even if that is the gate wiring 122 shown in FIG. 1, the capacity formed by the gate wiring 122 and the signal wiring 121 can be reduced, and the capacity relative to the semiconductor conversion element can be also reduced. In the case where the gate wiring 122 is arranged as the $3^{rd}$ metal layer 107 in the region put between the $1^{st}$ insulating film 106 and the $2^{nd}$ insulating film 109, the gate wiring 122 is arranged from the $1^{st}$ metal layer 101 through the through-hole. And, the signal wiring 121 is formed of the same metal layer as that of the source electrode and the drain electrode of the TFT at this time.

In the case of using the insulating film made of the organic material, the insulating film can be easily formed in case of using, for example, a photosensitive polyimide resin or a photosensitive acrylic resin, and applying the process of performing (1) the formation of an organic material insulating film, (2) exposure, (3) development and removal, and (4) baking. Moreover, the process of performing patterning using a photolithographic method using a photosensitive resist in the upper part, and performing the removal thereof by, for example, dry etching may be used.

Moreover, although the semiconductor conversion element in the upper part is described as the MIS type semiconductor conversion element in FIG. 2, a PIN type semiconductor conversion element composed of an n-type semiconductor layer, a $2^{nd}$ high resistance semiconductor layer, and a p-type semiconductor layer may be used. At this time, also similarly in the case of the PIN type semiconductor conversion element, when the resistance of the p-type semiconductor layer and the n-type semiconductor layer is low, the p-type semiconductor layer and the n-type semiconductor layer can be used also as electrode layers. Moreover, amorphous selenium, cadmium telluride or the like, which performs the direct conversion of a radiation, which directly converts a radiation into electric carriers, may be used as the semiconductor conversion element.

FIG. 3 is a simplified equivalent circuit diagram of the radiation imaging apparatus shown in FIGS. 1 and 2.

The radiation imaging apparatus is an example of the radiation imaging apparatus composed of pixels arranged in a matrix, a substrate including the gate wiring or the signal wiring, each including the number of wires corresponding to the rows or the columns, respectively, a signal processing circuit unit, a gate driver circuit unit and a common electrode driver circuit unit, each arranged in the surrounding of the substrate. Each pixel is composed of a couple of a semiconductor conversion element and a TFT.

On the substrate 160, the pixels, in each of which a TFT portion 152 and a semiconductor conversion element portion 153 are coupled with each other, are arranged in the matrix. The gate wiring 154 and the signal wiring 155 are connected with the TFT portion 152, and the bias wiring 157 from the common electrode driver circuit unit 156 is connected with the semiconductor conversion element portion 153.

The signal wiring 155 is connected with S1-S6 of the signal processing circuit unit 150 arranged on the outside of the substrate 160, and an image is produced by reading the electric carriers generated in the semiconductor conversion element portion 153 through the TFT unit 152. The gate wiring 154 is connected with the gate driver circuit unit 151 arranged on the outside of the substrate 160 similarly, and the voltages of the gate electrodes are controlled with G1-G6 to control the turning on/off of the TFT units 152. The common electrode driver circuit unit 156 controls the voltages to be applied to the semiconductor conversion elements, and supplies the voltages especially to the high resistance semiconductor layers in the semiconductor conversion elements. At that time, for instance, it is possible to select a depleting bias and an accumulation bias, and to control the largeness of the voltages to be supplied to control the intensity of the electric field. In particular, in the case of using the MIS type semiconductor conversion element, it is necessary to control the voltage to remove the holes or the electrons accumulated in the interface of the insulation film and the high resistance semiconductor layer after reading the electric carriers, and the control of the voltage is performed by the common electrode driver circuit unit 156.

Although each wire of the bias wiring 157 is arranged at the center of each of the semiconductor conversion element units 153 in FIG. 3, it may be said that the wires are actually located in the regions where the $4^{th}$ metal layers 108, which are the lower electrodes of the semiconductor conversion elements, are not arranged.

Two signal processing circuit units 150 and two gate driver circuit units 151 may be arranged on the upper and the lower sides, and the left and the right sides, respectively. In the case of arranging the signal processing circuit units 150 on the upper and the lower sides, the signal wiring 121 may be divided into two portions at the center, for example, to control the signals of the upper half portion thereof with the signal processing circuit units one the upper side and to control the signals of the lower half portion thereof with the signal processing circuit units on the lower side. In the case where the gate driver circuit unit 151 is arranged on the left and the right sides, the gate wiring 122 may be divided into two portions at the center, or the gate wiring 122 may be left in the sate of being connected.

Second Embodiment

A second embodiment of the present invention is described.

FIGS. 4 to 10 are plan views and sectional views of the radiation detecting apparatus according to the second embodiment of the present invention, and simplified equivalent circuit diagrams of the radiation detecting apparatus.

The gist of the present embodiment is that a plurality of wires of signal wiring is arranged to a plurality of pixels of one column, and that the plurality of pixels of one column is distributed to each wire of the signal wiring in order so that each wire of the signal wiring is connected to the thin film transistors of the distributed pixels.

Figure 4:
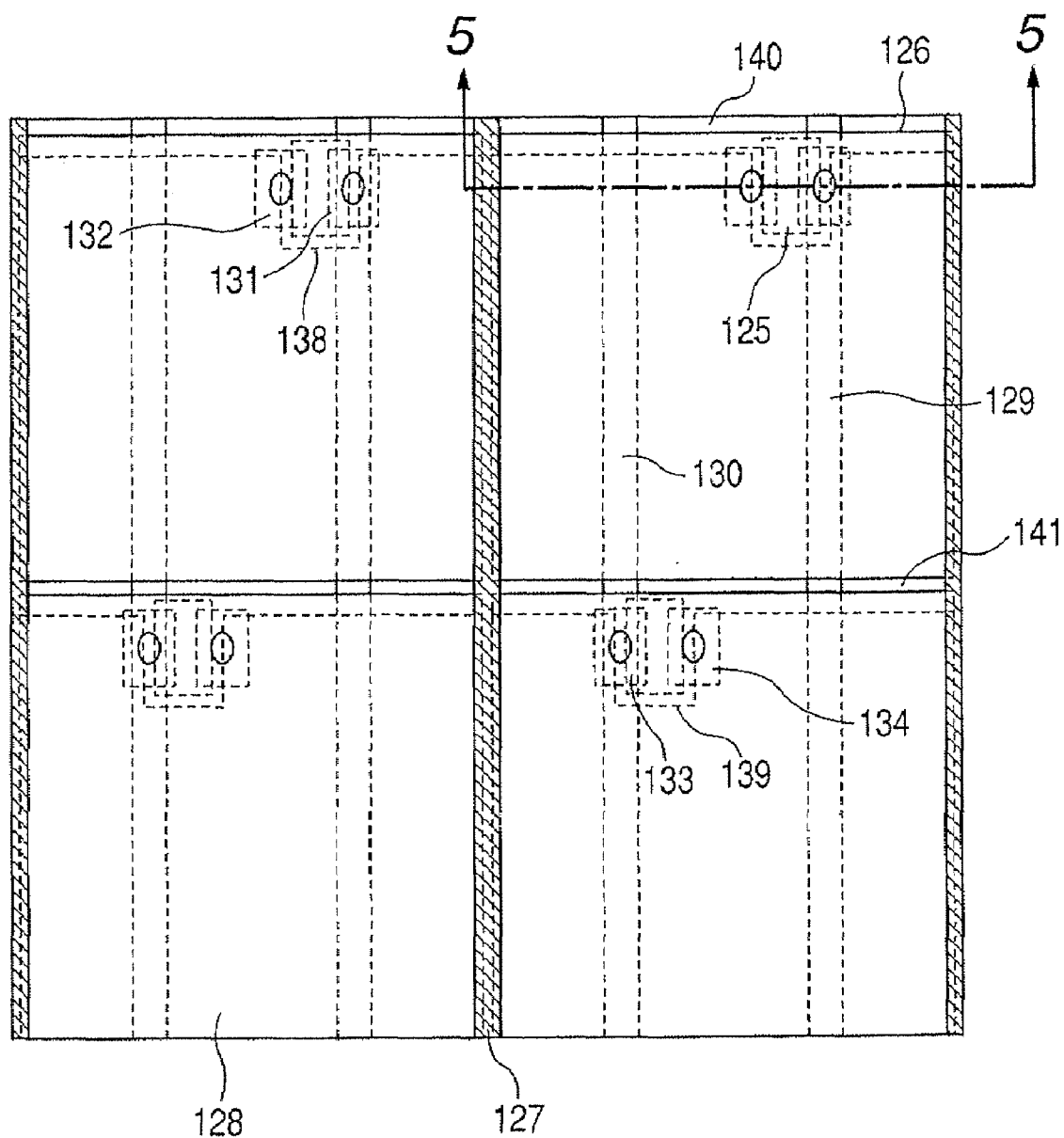
FIG. 4 is a plan view of pixels of a radiation detecting apparatus according to a second embodiment of the present invention.

FIG. 4 is a plan view of pixels of the radiation detecting apparatus according to the second embodiment of the present invention.

FIG. 4 is a plan layout view showing a pixel part composed of two rows by two columns in the effective pixel region where pixels, in each of which a conversion element converting an radiation into an electric signal and a switching element are coupled, are arranged in a matrix on an insulating substrate. Four wires of the signal wiring are arranged. The pixels of one column are distributed into two in order, and correspond to the wires of the signal wiring of two systems.

The semiconductor conversion elements of the present embodiment are also semiconductor conversion elements converting radiation into electric signals. In the case of using photoelectric conversion elements converting lights such as visible lights into electric signals, a phosphor layer is arranged over the photoelectric conversion elements.

The TFTs, which are switching elements, are described. Each of one group of them is a TFT that is composed of three electrodes of a $1^{st}$ source electrode 131, a $1^{st}$ drain electrode 132 and a $1^{st}$ gate electrode 138, which are arranged on the insulating substrate. Each of the other group of them is a TFT that is composed of three electrodes of a $2^{nd}$ source electrode 133, a $2^{nd}$ drain electrode 134 and a $2^{nd}$ gate electrode 139. The TFTs are divided into these two systems of the TFTs. The pixels of each column are distributed into two groups in order, and two wires of the signal wiring connected to the signal processing circuit unit 150 performing the read processing of accumulated electric carriers are arranged in each column. That is, the wires of the signal wiring are divided into a $1^{st}$ signal wiring 129 connected to the $1^{st}$ source electrode 131, and a $2^{nd}$ signal wiring 130 connected to the $2^{nd}$ source electrode 133. Moreover, the gate driver circuit unit 151, which controls the turning on or the turning off of the TFTs, is connected with a $1^{st}$ gate wiring 140 connected to the $1^{st}$ gate electrode 138, and a $2^{nd}$ gate wiring 141 connected with the $2^{nd}$ gate electrode 139. The channel portion 125 of the TFT exists between each source electrode and each drain electrode, and it is possible to control the flow and the stop of electric carriers through the channel portion 125 by the control of the voltage of each gate electrode.

A semiconductor conversion element is composed of the lower electrode 126, the light receiving region 128 and the bias wiring 127, and is arranged over the top surfaces of a TFT. Two lower electrodes arranged in the upper side in the view among the lower electrodes 126 are connected with the $1^{st}$ drain electrodes 132 through through-holes, and two lower electrodes arranged in the lower side in the view are connected with the $2^{nd}$ drain electrodes 134 through through-holes.

After a radiation has been irradiated and electric carriers have been accumulated in pixels according to the quantity of the irradiation, information is transferred to the signal processing circuit unit 150 through the TFTs. At this time, in order to increase the number of signals that can be transferred at a time, the wires of the signal wiring are separated into two systems. In FIG. 4, the signal wiring connected with the $1^{st}$ source electrodes 131 of the TFTs connected with the $1^{st}$ gate wiring 140 is set to be the $1^{st}$ signal wiring 129. The signal wiring connected with the $2^{nd}$ source electrode 133 of the TFTs connected with the $2^{nd}$ gate wiring 141 is set to be the $2^{nd}$ signal wiring 130. The $1^{st}$ gate wiring 140 and the $2^{nd}$ gate wiring 141 are connected with each other in the substrate before the gate driver circuit unit 151, and the pieces of the gate wiring 140 and 141 are configured to be able to be driven at the same time. When an on-voltage of the TFTs is applied to the both pieces of the gate wiring 140 and 141 at the same time, the four TFTs shown in FIG. 4 are turned on at the same time, and electric carriers can be read from the four wires of the signal wiring in all of both the $1^{st}$ signal wiring 129 and the $2^{nd}$ signal wiring 130.

In the present view, each signal wiring is arranged under the lower electrodes 126, and are connected with each of the source electrodes 131 and 133 arranged still under each of the signal wiring 129 and 130 through the through-holes. Each of the signal wiring 129 and 130 are arranged in the form of being put between the insulation film arranged under the lower electrodes 126 and the insulating film covering the TFT portions such as each of the source electrodes 131 and 133 and each of the drain electrodes 132 and 134.

Figure 5:
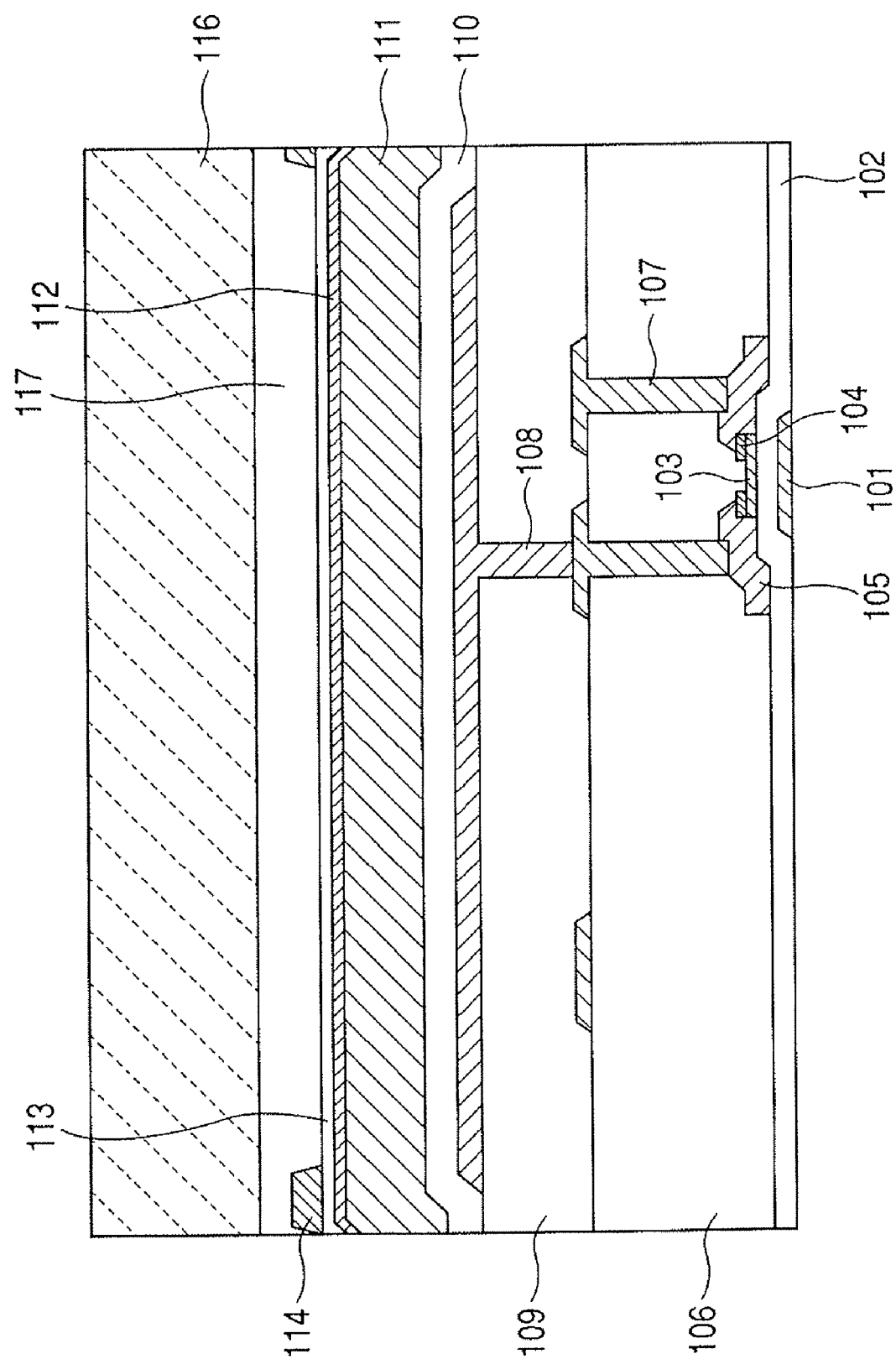
FIG. 5 is a sectional view taken along a line 5-5 in FIG. 4.

FIG. 5 is a sectional view taken along a line 5-5 in FIG. 4. The upper part thereof shows a semiconductor conversion element, and the lower part thereof shows a TFT. FIG. 5 shows an example in which wiring is arranged in a region put between the $1^{st}$ insulating film and the $2^{nd}$ insulating film above a source electrode or a drain electrode in order to decrease the capacity of the signal wiring.

The description relative to the portions common to those shown in FIG. 2 is omitted.

The semiconductor conversion element in the upper part is an MIS type semiconductor conversion element composed of the $4^{th}$ metal layer 108, the insulating film 110 of the semiconductor conversion element, the $2^{nd}$ high resistance semiconductor layer 111, the $2^{nd}$ impurity semiconductor layer 112, which is an ohmic contact layer, and the transparent electrode layer 113. The semiconductor conversion element can perform the photoelectric conversion of a light such as a visible light. The $5^{th}$ metal layers 114 are bias wiring for applying a voltage to the transparent electrode layer 113, and is connected with the common electrode driver 156 arranged on the outside of the substrate.

Each of the signal wiring 129 and 130 shown in FIG. 4 is formed of the $3^{rd}$ metal layers 107 in FIG. 5, and is arranged in the region put between the $1^{st}$ insulating film 106 and the $2^{nd}$ insulating film 109. Hereupon, the $1^{st}$ insulating film 106 and the $2^{nd}$ insulating film 109 are preferably ones each having a thick film thickness and a low dielectric constant, and an insulating film made of an organic material having a low relative dielectric constant is used as them in the present embodiment. The organic material is preferably a one having a high heat resisting property such as a polyimide resin, an acrylic resin or the like, and the relative dielectric constant is preferably lower one of the degree of from about 2.5 to about 4. The film thicknesses of the insulating films 160 and 109 made of the organic material are preferably severally 1 μm or more.

Thereby, even if the signal wiring is divided into the two systems and the double number of the wires thereof in comparison with the number of the ordinary case are arranged as shown in FIG. 4, it is possible to prevent the enlargement of the capacity between the signal wiring and each wire of the gate wiring intersecting with the signal wiring and the capacity between the semiconductor conversion elements arranged in the upper part and each wire of the signal wiring. As a result, it is possible to increase the number of the signals capable of being taken in at the same time as described above without increasing the time constant of the gate wiring, which is composed of the capacity and the resistance of the gate wiring, and consequently the radiation imaging apparatus capable of being driven at a high speed can be provided.

Moreover, although the semiconductor conversion element in the upper part is described as an MIS type semiconductor conversion element in FIG. 5, a PIN type semiconductor conversion element may be similarly used, or amorphous selenium, cadmium tellurium or the like, which performs the direct conversion of a radiation, may be used as the semiconductor conversion element.

Figure 6:
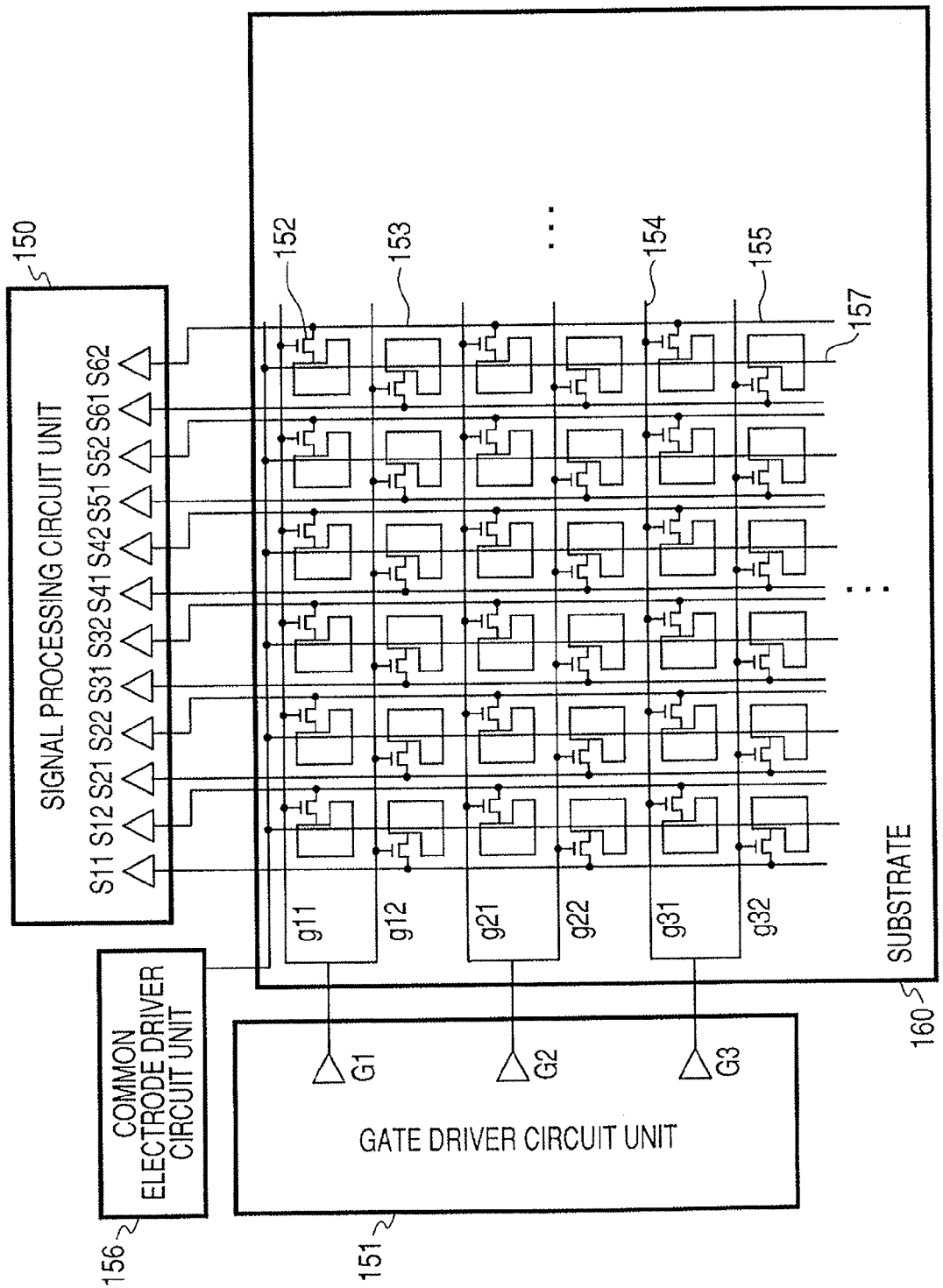
FIG. 6 is a simplified equivalent circuit diagram of the radiation imaging apparatus of the present invention shown in FIGS. 4 and 5.

FIG. 6 is a simplified equivalent circuit diagram of the radiation imaging apparatus shown in FIGS. 4 and 5.

FIG. 6 shows an example of a radiation imaging apparatus composed of a substrate on which pixels are arranged in a matrix, gate wiring, the number of the wires of which is equivalent to the number of rows, and signal wiring, the number of the wires of which is twice as much as the number of columns; a signal processing circuit unit; a gate driver circuit unit; and a common electrode driver circuit unit, those circuit units arranged in the surrounding of the substrate.

Each of the pixels is composed of a semiconductor conversion element and TFT, both coupled with each other.

On the substrate 160, the pixels, each composed of the TFT portion 152 and the semiconductor conversion element portion 153, both coupled with each other, are arranged in the matrix. The gate wiring 154 and the signal wiring 155 are connected with the TFT portion 152, and the bias wiring 157 from the common electrode driver circuit unit 156 is connected with the semiconductor conversion element portion 153. Wires g11 and g12, wires g21 and g22, and wires g31 and g32 of the gate wiring 154 are severally mutually connected, and each of the wires g11, g12, g21, g22, g31 and g32 can be controlled by the gate driver circuit unit 151 with three pieces of wiring G1-G3. For instance, when an on-voltage of a TFT is applied to the wiring G1, the on-voltage of a TFT is applied to the wires g11 and g12 of the gate wiring 154 at the same time. At this time, electric carriers can be read from both groups of wires s12, s22, s32, . . . , which are connected with the TFTs connected with the wire g11, and wires s11, s21, s31, . . . , which are connected with the TFTs connected with the wire g12, of the signal wiring at the same time with the signal processing circuit unit 150. Consequently, it is possible to perform a high speed drive.

Figure 7:
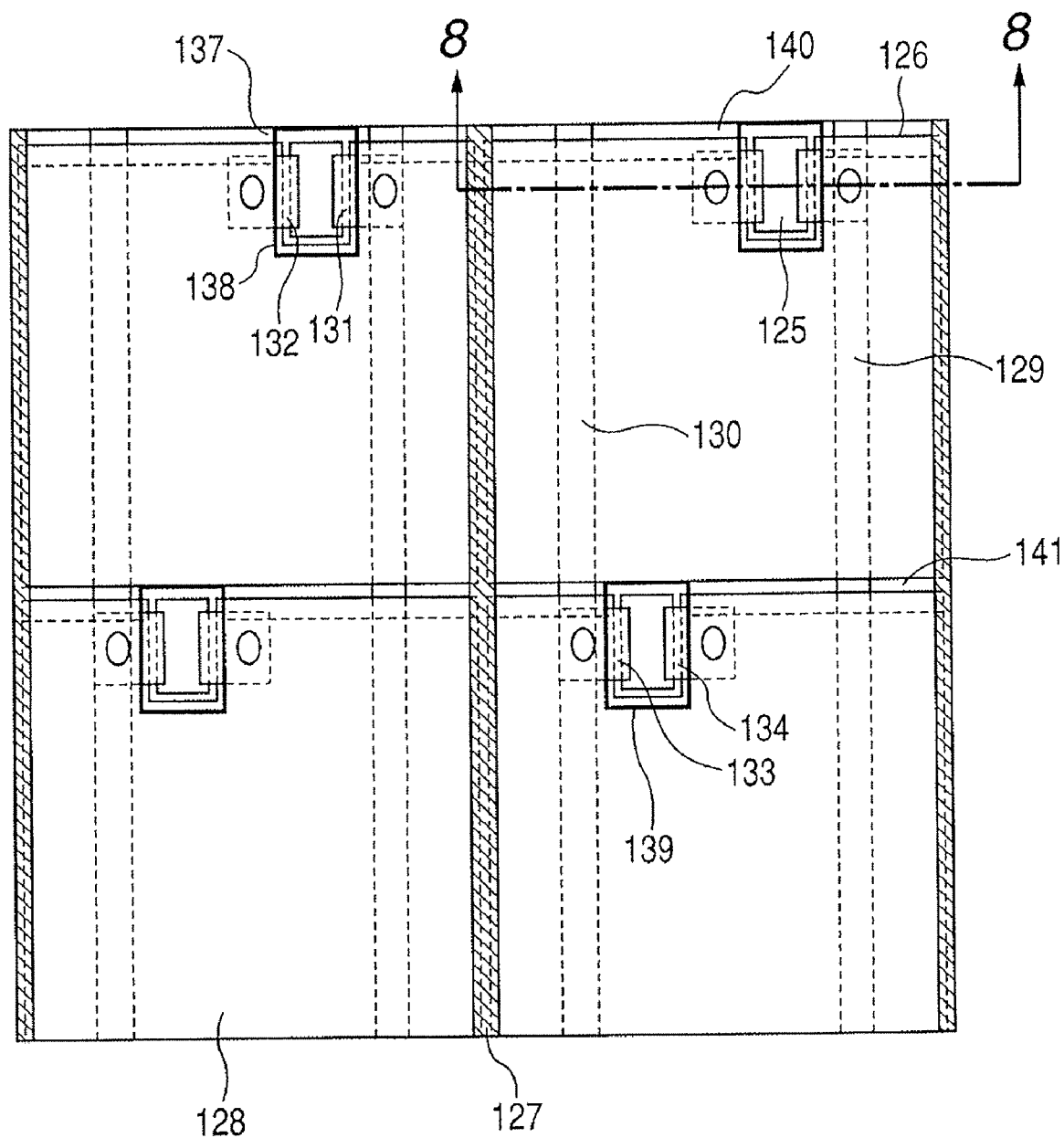
FIG. 7 is another plan view showing pixels of the radiation detecting apparatus according to the second embodiment of the present invention, which view is different from one shown in FIG. 4.

FIG. 7 is a plan view showing pixels of a radiation detecting apparatus according to the second embodiment, and is a plane layout view showing the pixels of an example different from that of FIG. 4.

The respect in which the radiation detecting apparatus differs from the one shown in FIG. 4 is that the light receiving regions of the semiconductor conversion elements arranged in the upper part are arranged so as to avoid at least a part of the source electrodes, the drain electrodes and the gate electrodes of the TFTs, and the channel portions.

As an example, the radiation detecting apparatus differs from the one shown in FIG. 4 in that light receiving region aperture portions 137 are formed, and that each of the source electrodes and each of the drain electrodes are severally formed in a larger size. In the manufacturing process of a TFT, defects occur at a certain probability. At this time, it is possible to check the influences of the pixels including the defects by transpiring the TFT portions with, for example, a laser light to electrically separate the pixels including the defects. At this time, the information of the defect-including pixels can be dealt with by performing the correction using the information in the surrounding of the pixels. At this time, it is necessary to remove a light receiving region which easily absorbs a light beforehand in order to rapidly find the defect portions and to expose each source electrode and each drain electrode to be transpired.

Figure 8:
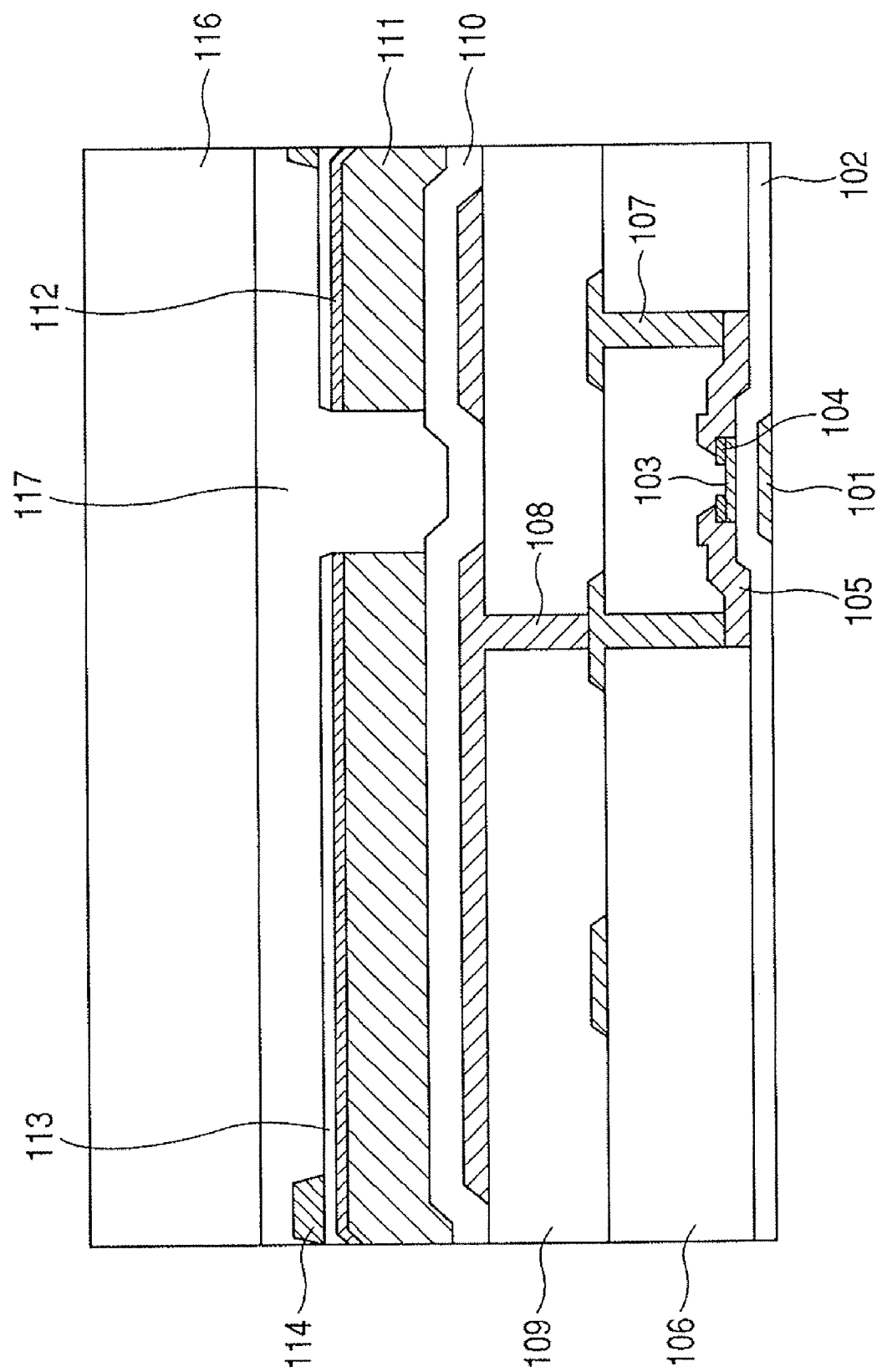
FIG. 8 is a sectional view taken along a line 8-8 in FIG. 7.

FIG. 8 is a sectional view taken along a line 8-8 in FIG. 7.

FIG. 8 shows a semiconductor conversion element in the upper part thereof and a TFT in the lower part thereof. FIG. 8 shows an example in which each piece of the signal wiring 129 and 130 is arranged in a region put between the $1^{st}$ insulating film 106 and the $2^{nd}$ insulating film 109 above the source electrode 131 or the drain electrode 132, and in which a light receiving region is opened above the TFT in order to reduce the capacity of the signal wiring.

The description of the portions common to those shown in FIG. 5 is omitted.

The $2^{nd}$ high resistance semiconductor layer 111, which is arranged above the TFT and especially easily absorbs a light, is removed only in the part located just above the TFT. At this time, although the insulating film 110 of the semiconductor conversion element is not removed to remain as it is, the insulating film 110 may be removed at the same time as the removal of the $2^{nd}$ high resistance semiconductor layer 111.

By adopting such a configuration, it becomes possible to transpire defect parts with a laser light to form a phosphor layer after that before arranging the phosphor layer on the protection layer 117, and to secure a high yield.

Moreover, when the $2^{nd}$ high resistance semiconductor layer 111 are arranged over the whole surface as shown in FIG. 5, the transpiration of a part with a laser light for restoring a defect causes a defect in the $2^{nd}$ high resistance semiconductor layer 111 to influence the surrounding of the defect. Accordingly, it is necessary to remove the $2^{nd}$ high resistance semiconductor layer 111 in all the regions where the laser light is irradiated. Such a configuration can be applied not only to the MIS type semiconductor conversion element but also to the PIN type semiconductor conversion element mentioned above, and further can be applied to the case where a direct converting material is used. Moreover, although the $2^{nd}$ high resistance semiconductor layer 111 is removed in almost the same region as the portion where the gate electrode made of the $1^{st}$ metal layer 101 is arranged in FIG. 8, it is preferable that the high resistance semiconductor layer 111 is opened in a region wider than the $1^{st}$ metal layer 101 by a little in order to irradiate the laser light stably.

Figure 9:
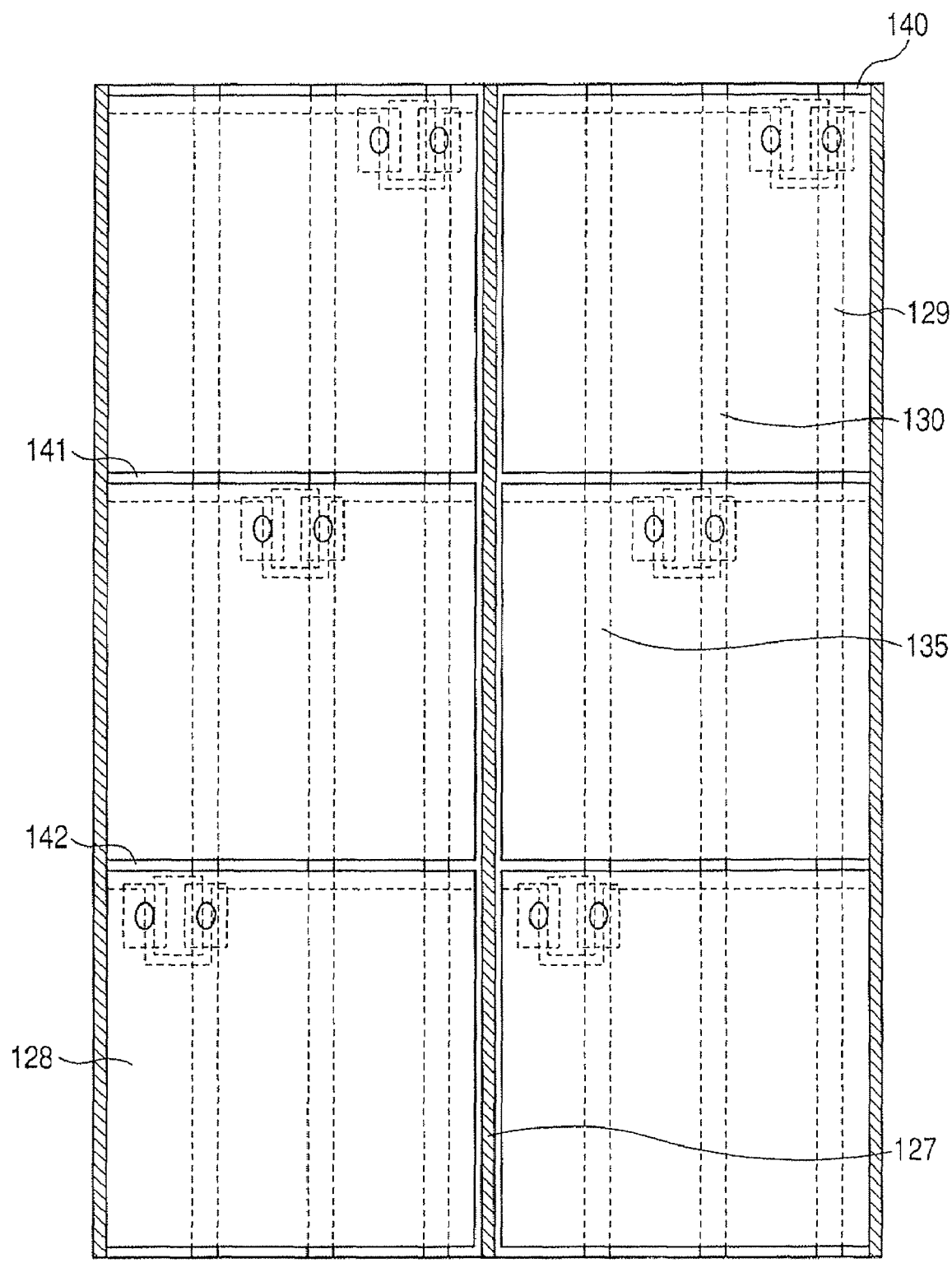
FIG. 9 is further plan view showing pixels of the radiation detecting apparatus according to the second embodiment of the present invention, which view is different from ones shown in FIGS. 4 and 7.

FIG. 9 is a plan view showing pixels of a radiation detecting apparatus according to the second embodiment.

FIG. 9 is a plan layout view showing an example of the pixels different from those shown in FIGS. 4 and 7. FIG. 9 shows a pixel part composed of three rows by two columns in the effective pixel region, in which pixels, each including a TFT and a semiconductor conversion element coupled with the TFT, are arranged in a matrix. The respect different from the pixel part shown in FIG. 4 is that six wires of signal wiring are arranged. The pixels in one row are distributed into three portions in order, and correspond to three systems of wires of the signal wiring.

The pixel part is different from the ones shown in FIGS. 4 and 7 in that three wires of the $1^{st}$ signal wiring 129, the $2^{nd}$ signal wiring 130 and a $3^{rd}$ signal wiring 135 are arranged in one column, and consequently that six wires of the signal wiring are provided in the pixels arranged in a matrix composed of three rows by two columns. Moreover, three wires of the $1^{st}$ gate wiring 140, the $2^{nd}$ gate wiring 141 and a $3^{rd}$ gate wiring 142 are arranged. Each signal wiring shown in FIG. 9 is arranged in the region put between organic materials having a low relative dielectric constant severally, and consequently it is possible to reduce the capacity generated between the signal wiring and the wiring in the surrounding or the semiconductor conversion elements in the upper part. Thereby, even if the signal wiring is divided in three systems and the number of the arranged wires is three times as many as that of the normal case, the capacity of each gate wiring intersecting with these wires of the signal wiring can be prevented from increasing. Moreover, as for the signal wiring, because the number of TFTs connected with one wire of the signal wiring decreases, the capacities formed between the source electrodes and the gate electrodes in the TFT portions become smaller, and the total capacity of the signal wiring can be also made to be small.

As a result, the degree of freedom of the method of drawing around each wiring increases, and drawing around a plurality of wires in the pixels arranged in one row or one column become possible. And, the number of the signals that can be taken in at the same time can be increased, as mentioned above, without increasing the time constant of the gate wiring, which is composed of the capacity and the resistance of the gate wiring. Consequently, a radiation detecting apparatus that can be driven at a higher speed can be provided. Although the number of the arranged wires of the signal wiring is three times as many as that of the normal case in FIG. 9, the number of the arranged signal wiring may be a plurality of times, such as four times, five times and the like. Moreover, when the capacity between the gate wiring and the signal wiring forms a large proportion of a TFT portion, such a configuration would decreases the number of the TFTs connected to one wire of the gate wiring or one wire of the signal wiring to ¼, ⅕ and so forth. Consequently, such a configuration leads to the further reduction of the capacity of each wiring.

Figure 10:
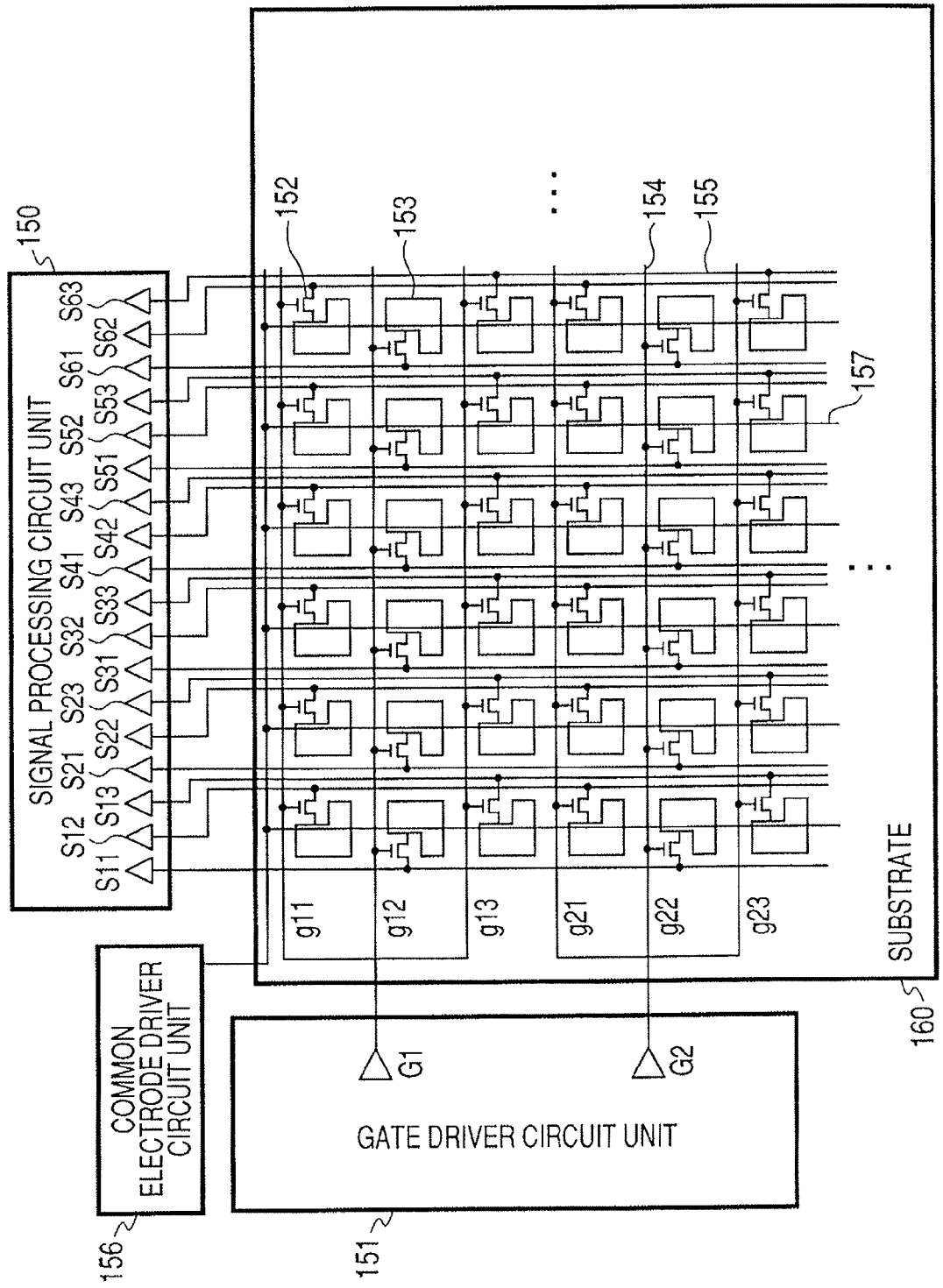
FIG. 10 is a simplified equivalent circuit diagram of the radiation imaging apparatus shown in FIG. 9.

FIG. 10 is a conceptual diagram of the simplified equivalent circuit of the radiation imaging apparatus shown in FIG. 9 and the peripheral circuitry thereof.

FIG. 10 shows an example of the radiation imaging apparatus composed of a substrate including pixels arranged in a matrix, gate wiring corresponding to the number of rows and signal wiring, the number of the wires of which is three times as many as the number of columns; a signal processing circuit unit; a gate driver circuit unit; and a common electrode driver circuit unit, the circuit units arranged in the surrounding. In a pixel, a semiconductor conversion element and a TFT are coupled.

In the substrate 160, the pixels, in each of which the TFT portion 152 and the semiconductor conversion element portion 153 are coupled with each other, are arranged in the matrix. The gate wiring 154 and the signal wiring 155 are connected with the TFT portions 152, and the bias wiring 157 from the common electrode driver circuit unit 156 is connected with the semiconductor conversion element portions 153. Three wires g11-g13 and three wires g21-g23 of the gate wiring 154 are connected mutually in each group, and can be controlled by the gate driver circuit unit 151 with two wires G1 and G2. For instance, when an on-voltage of a TFT is applied to the wire G1, the on-voltage of a TFT is applied to the wires g11, g12 and g13 of the gate wiring 154 at the same time. At this time, the electric carriers in the three rows can be simultaneously read. The electric carriers on the $1^{st}$ row are read from the wires s12, s22, s32, . . . of the signal wiring, which are through the TFTs connected with the wire g11. The electric carriers of the $2^{nd}$ row are read from the wires s11, s21, s31, . . . of the signal wiring, which are through the TFTs connected with the wire g12. Then, the electric carriers of the $3^{rd}$ row are read from the wires s13, s23, s33, . . . of the signal wiring, which are through the TFTs connected to the wire g13. The signal processing circuit 150 can read the electric carriers from all of the wires of the signal wiring at the same time. Consequently, it becomes possible to perform a high speed drive.

Also in the radiation detecting apparatus of such a configuration, by arranging the signal wiring in the region put between the $1^{st}$ insulating film 106 and the $2^{nd}$ insulating film 109, mentioned above, the increase of the capacity can be made to be small. Consequently, the drawing around of the wiring at a high degree of freedom becomes possible, and the method of the drawing around of the wiring can be changed to make it possible to provide a radiation detecting apparatus capable of dealing with a high speed moving image with low noises.

Third Embodiment

Figure 11:
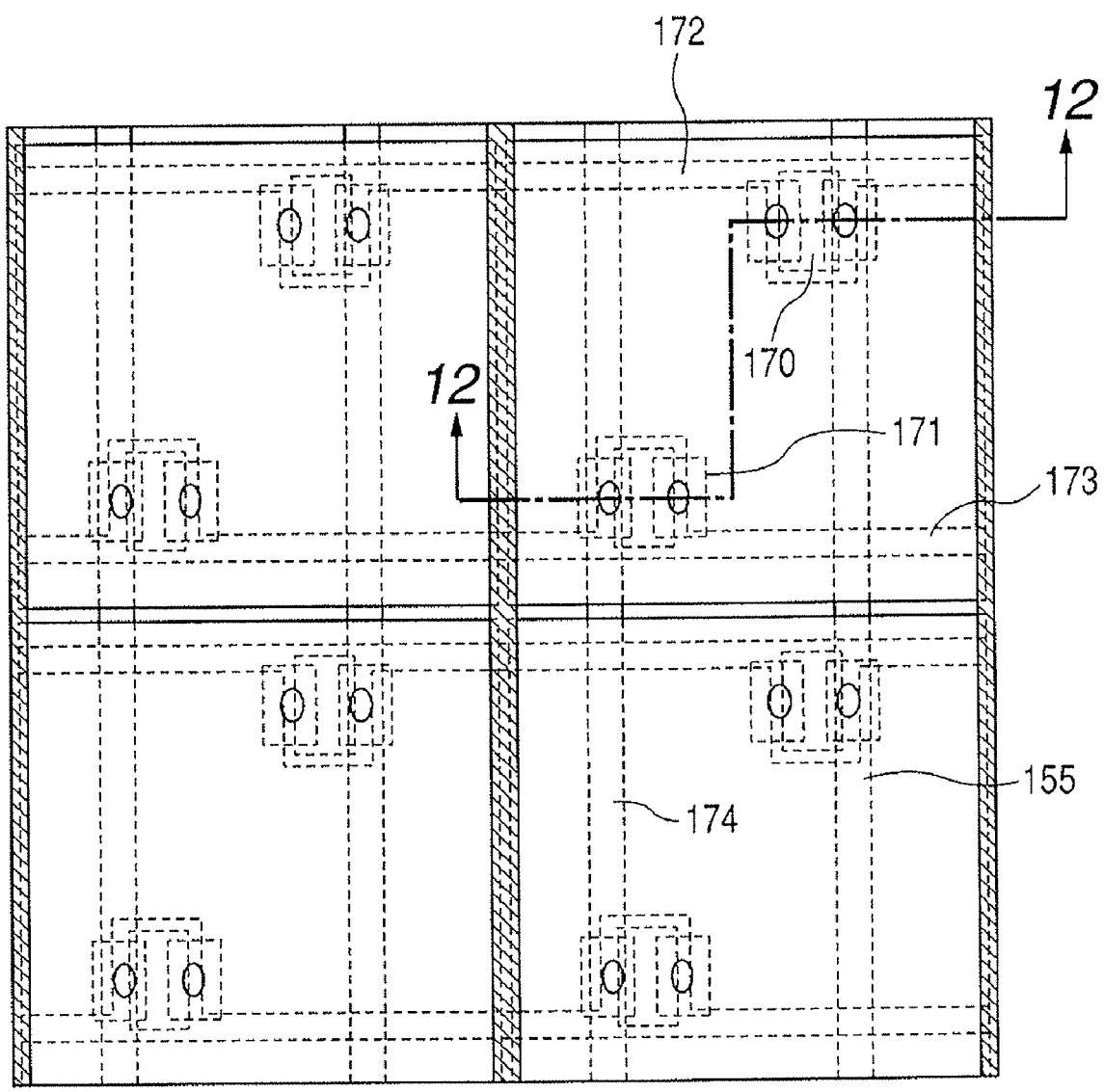
FIG. 11 is a plan view of pixels of a radiation detecting apparatus according to a third embodiment of the present invention.
Figure 12:
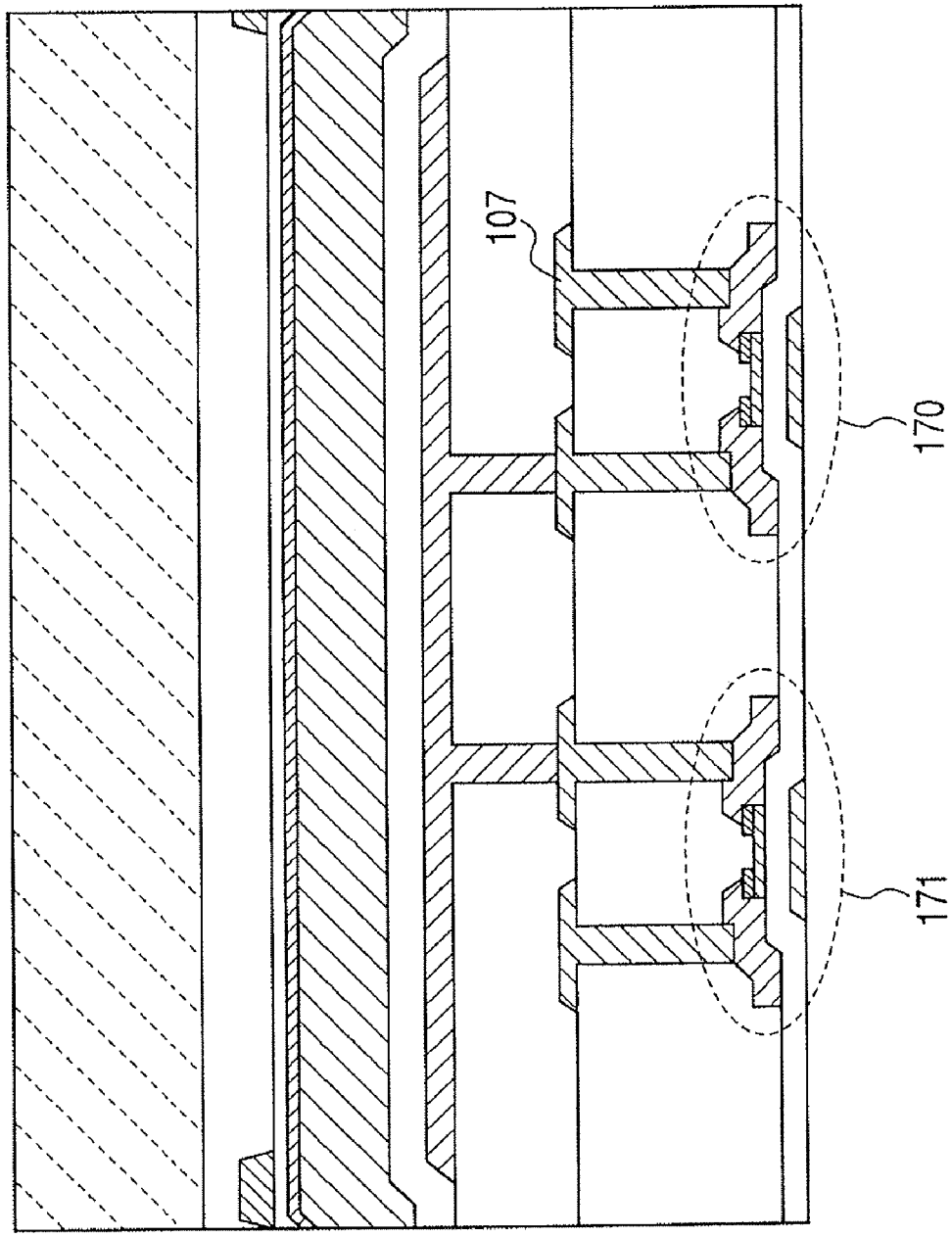
FIG. 12 is a sectional view taken along a line 12-12 in FIG. 11.
Figure 13:
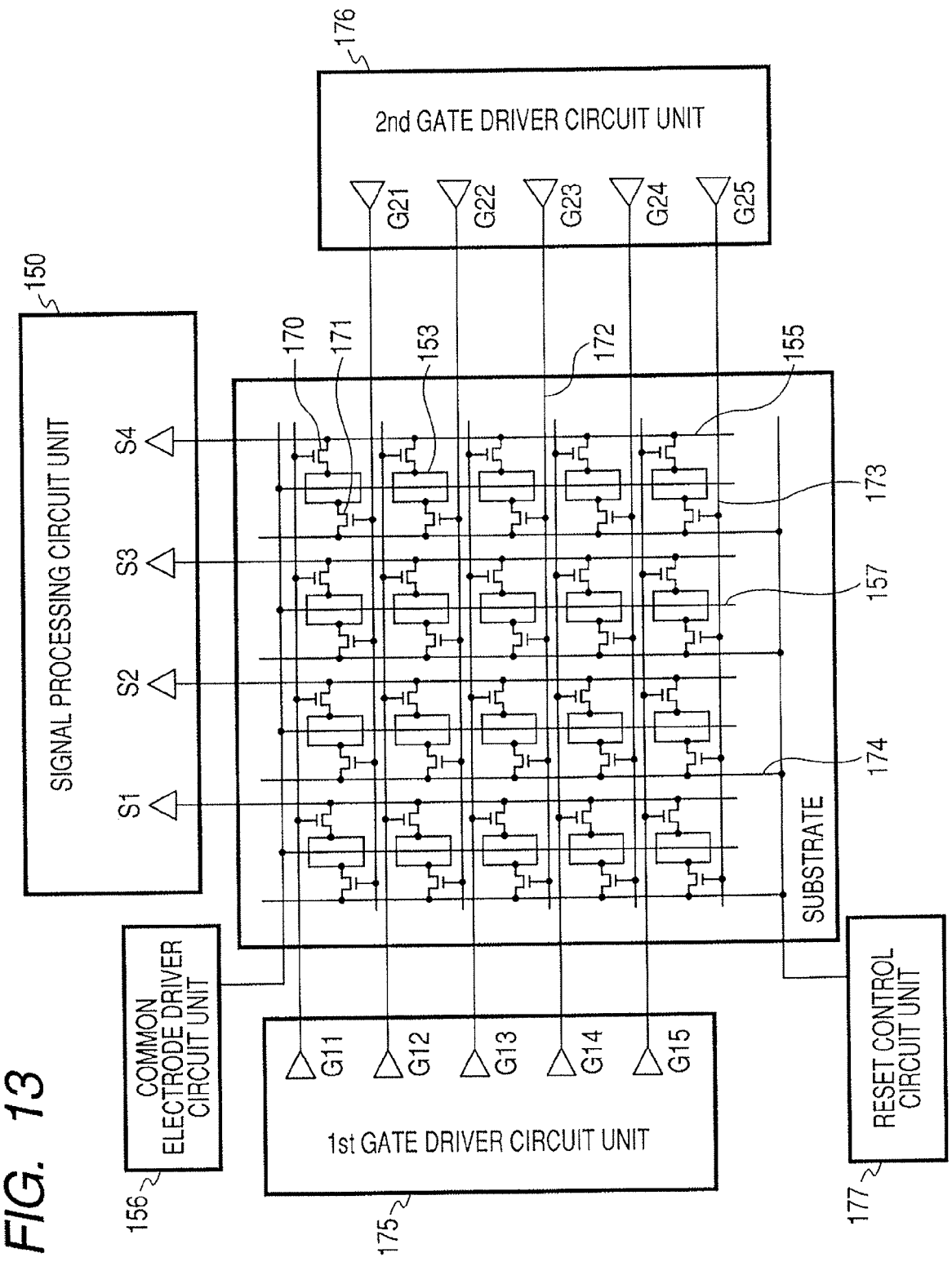
FIG. 13 is a simplified equivalent circuit diagram of a radiation imaging apparatus according to the third embodiment of the present invention.

FIGS. 11 to 13 are a plan view and a sectional view showing pixels of a radiation detecting apparatus according to a third embodiment of the present invention and a simplified equivalent circuit diagram of the radiation imaging apparatus.

The third embodiment provides a radiation detecting apparatus including two transistors in a pixel in order to enable a high speed drive and enabling radiographing of moving image. The gist of the present embodiment is that pixels, each including one semiconductor conversion element and two TFTs coupled with the semiconductor conversion element, are two-dimensionally arranged, and that the two TFTs are used under the objection of, for example, electric carriers transfer for one of them and resetting for the other. According to the present embodiment, for example, it becomes possible to perform the resetting of the pixels the transfers of the electric carriers of which have been completed at the same time when the electric carriers of a specific pixel is transferred.

When the pixels having such a configuration are formed, the number of the wires of the gate wiring connected with the TFTs are required to be twice as many as the one in the case where the TFTs for resetting are not provided if the formation of the pixels are realized by the conventional configuration. Consequently, the number of the wires of the gate wiring intersecting with the signal wiring increases to enlarge the capacity of the signal wiring. In the case of acquiring a moving image by driving the radiation detecting apparatus at a high speed, it is necessary to decrease the exposing quantity of a radiation to the lower limit in order to reduce the exposure dose of a subject. However, the enlargement of the capacity of the signal wiring increases the noises of the detecting apparatus to deteriorate the image quality in low radiation regions. Consequently, the necessity of increasing the exposure quantity of radiation is brought about.

Moreover, because not only the signal wiring but also the reset wiring intersect with each wire of the gate wiring as the wiring intersecting with each wire of the gate wiring, the number of wires intersecting with each wire of the gate wiring increases to enlarge the capacity of the gate wiring. As a result, the time constant of the gate wiring becomes larger to make it impossible to increase the drive speed.

Accordingly, description is given to the configuration of arranging two TFTs in order to perform a high speed drive for a moving image in the present embodiment. The present embodiment adopts a configuration capable of providing a radiation detecting apparatus enabling radiographing of moving image capable of the high speed drive with low noises by considerably reducing the capacity between each wire of the gate wiring and the signal wiring or the reset wiring in the case of the configuration of arranging two TFTs.

FIG. 11 is a plan view showing the present embodiment, and shows pixels in each of which two TFTs, which are switching elements, and a semiconductor conversion element are coupled with each other. The signal wiring 155 connected with the signal processing circuit unit is connected with $1^{st}$ TFTs 170. Moreover, the reset wiring to reset the electric carriers accumulated in the pixels is connected with $2^{nd}$ TFTs 171. Moreover, a $1^{st}$ gate wiring 172 connected with a $1^{st}$ gate driver circuit 175, which controls the $1^{st}$ TFTs 170, is connected with a $1^{st}$ gate electrode. $2^{nd}$ gate wiring 173 connected with a $2^{nd}$ gate driver circuit 176, which controls the $2^{nd}$ TFTs 171, is connected with a $2^{nd}$ gate electrode. Moreover, the semiconductor conversion elements are connected with both the $1^{st}$ TFTs 170 and the $2^{nd}$ TFTs 171. By using such pixels shown in the plan view, it becomes possible to simultaneously perform an operation of transferring electric carriers in a semiconductor conversion element to the signal processing circuit through the signal wiring 155 and an operation of resetting the remaining electric carriers accumulated in a pixel the transfer of the electric carriers of which has been completed. For instance, the present embodiment is configured so that it is possible to reset the remaining electric carriers of the semiconductor conversion elements, the reading of the electric carriers accumulated in which have been completed, on the lower side of FIG. 11 through reset wiring 174 while reading the electric carriers accumulated in the semiconductor conversion elements on the upper side in FIG. 11. As a result, it becomes possible to simultaneously perform reading and the processing of resetting, and consequently it becomes possible to attain a high speed drive.

It is to reduce the increasing capacity of each wiring that becomes a problem in the case of adopting the configuration of the pixels, each having two TFTs. For instance, the number of crossing of the signal wiring 155 across the gate wiring increases to be twice as many because the number of the wires of the gate wiring doubled. As a result, the capacity of the signal wiring 155 increases and it leads to increasing the noises of the sensors.

Moreover, also from the view of the gate wiring, the number of crossing the wiring increases to be twice as many because the gate wiring crosses not only the signal wiring but also the reset wiring 174. As a result, the time constant of the gate wiring increases more than that of the configuration of being equipped with one TFT per pixel, and it becomes necessary to lower the drive speed of driving the driver circuit.

Accordingly, the pixel configuration equipped with two TFTs per pixel can be achieved without increasing the capacity between the signal wiring and each wire of the gate wiring by forming insulating films each having a thick film thickness at the intersecting parts between each wiring as shown in FIG. 12 to decrease the capacities of the intersecting parts. Consequently, a radiation imaging apparatus capable of performing a high speed drive with low noises can be achieved.

FIG. 12 is a sectional view showing the part of a line 12-12 in FIG. 11. The TFT on the right side in FIG. 12 expresses the $1^{st}$ TFT 170, and the TFT on the left side in FIG. 12 expresses the $2^{nd}$ TFT 171. As shown in the present view, the signal wiring made of the $3^{rd}$ metal layers 107 is arranged in the upper part with a thick insulating film put between the signal wiring and the TFTs. Moreover, the reset wiring also has a similar configuration. As a result, the gate wiring and the signal wiring can be arranged to be distant from each other, and it becomes possible to reduce the capacities produced at the intersecting parts of the wiring to the minimum. As the thick insulating film, a material enabling the formation to a thick film and having a small dielectric constant is desirable. For instance, in case of using an inorganic material, it is preferable to form a silicon oxide film or a silicon nitride film to have a thickness of from about 1.0 μm to about 4.0 μm. In case of using an organic material, for example, it is preferable to form a film to have a thickness of from about 3.0 μm to about 10.0 μm.

FIG. 13 is a simplified equivalent circuit diagram of the radiation imaging apparatus including the pixels, each having two TFTs and one semiconductor conversion element which are coupled with each other. The $1^{st}$ gate driver circuit 175 controlling the $1^{st}$ TFTs 170 for transferring electric carriers, and the $2^{nd}$ gate driver circuit 176 controlling the $2^{nd}$ TFTs 171 for resetting the pixels are arranged in the surrounding of the substrate. Furthermore, a signal processing circuit 150 connected to the signal wiring 155, a reset control circuit unit 177 connected to the reset wiring 174, and the common electrode driver circuit unit 156 connected with the bias wiring 157 are arranged. Hereupon, although the pixels are simply shown as a matrix of five rows by four columns, the pixels are actually composed of, for example, 1000 rows by 1000 columns.

By adopting the configuration mentioned above, a radiation imaging apparatus including the pixels, each equipped with two TFTs and one semiconductor conversion element coupled with the two TFTs, and enabling a high speed drive with low noises, can be realized.

Fourth Embodiment

A fourth embodiment of the present invention is described.

The gist of the present embodiment is that an insulating film made of an organic material having a low relative dielectric constant is used as a suitable material for constituting the insulating films to regulate the film thickness thereof in addition to the fist, the second and the third embodiments.

As for the organic material, a material such as a polyimide resin, an acrylic resin or the like having a high heat resisting property is desirable, and a material having a relative dielectric constant within a range of from about 2.5 to about 4 is preferable from the viewpoint of the relative dielectric constant. The film thickness of the insulating film made of the organic material is preferably 1 μm or more even in a region where the film thickness is thin.

The thicker the total film thickness of the insulating film made of the organic material is, the smaller the capacity can be made to be. However, the thicker the total film thickness of the insulating film becomes, the more difficult the working of the wiring arranged in a region put between the semiconductor converting layer arranged above the insulating film after the formation of the insulating film and the insulating film at the time of forming the wiring by a photolithographic method becomes. For instance, when the total film thickness of the insulating film becomes thick to exceed 20 μm, a region in which the adhesion property of a photosensitive photoresist is bad is generated owing to a large step at the time of coating the photoresist. Moreover, the film thickness of the resist becomes thicker only in the part in the concave portion in the step portion, and the photoresist cannot be completely exposed in the exposure and the development processes afterwards to generate a pattern residue. This situation is true also in the pixels, but, for example, at the boundary between the region where the insulating film is arranged and the region where the insulating film is not arranged in the region outside of the pixel region, the film thickness of the resist becomes thicker only at the boundary part and the pattern residue is generated along the boundary. For instance, when such pattern residue is generated at the time of performing the patterning of a metal film and a transparent electrode, a short circuit of the pattern between wires is caused. Consequently, it becomes difficult to perform a stable manufacturing by the photolithography process. Accordingly, it is necessary to perform arrangement while controlling the film thickness to be thicker at a necessary part and to be thinner at an unnecessary part according to the use of the insulating film to be used. Moreover, it is necessary to make the total film thickness of the insulating film 20 μm or less.

Figure 14:
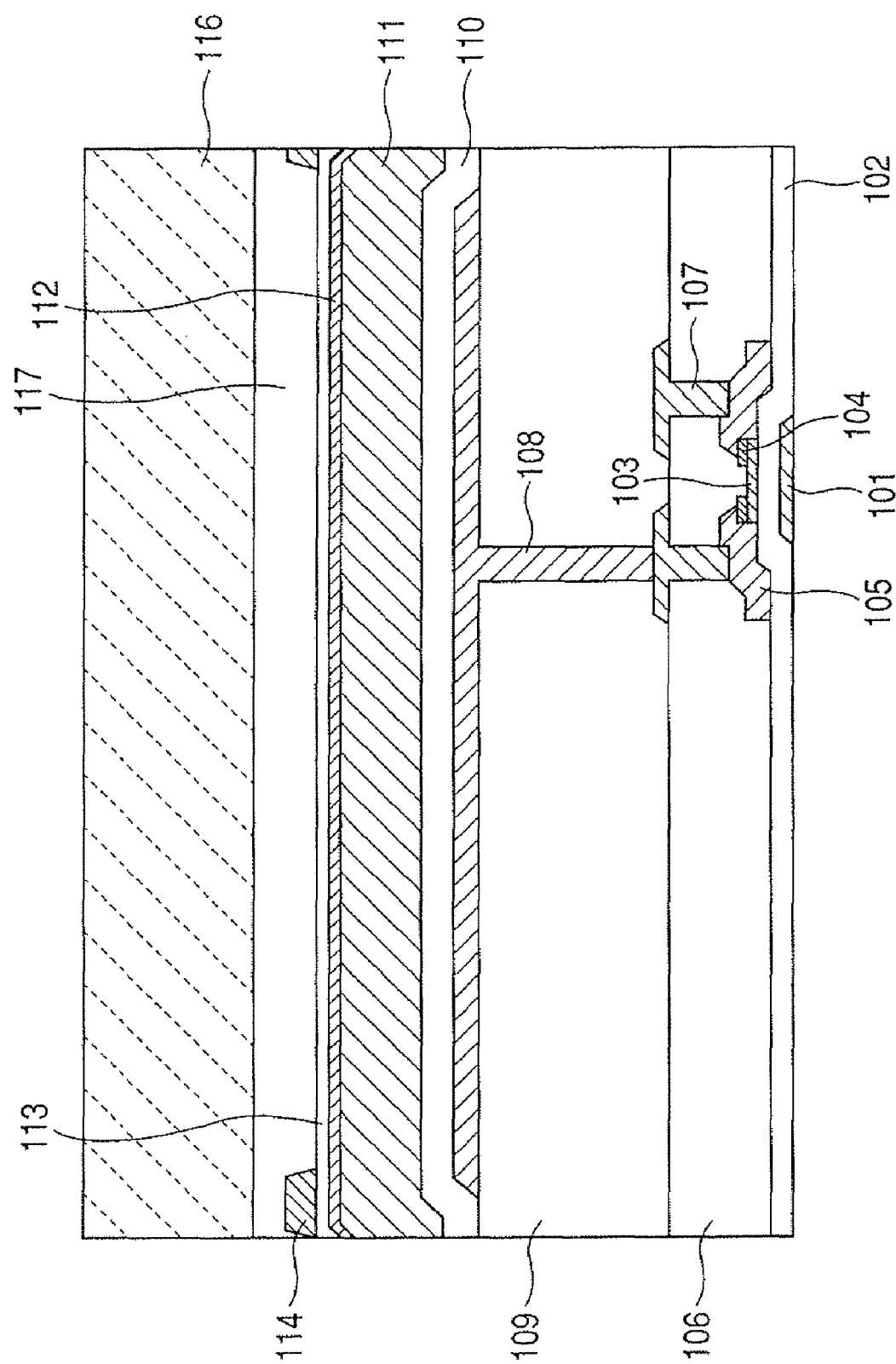
FIG. 14 is a sectional view of a pixel of a radiation detecting apparatus according to a fourth embodiment of the present invention taken along a line corresponding to the line 2-2 shown in FIG. 1.

FIG. 14 shows a case where an insulating film made of an organic material is used as the $1^{st}$ insulating film 106 and the $2^{nd}$ insulating film 109 in the present embodiment. As shown in FIG. 14, the film thickness of the $2^{nd}$ insulating film 109 is formed to be thicker than the film thickness of the $1^{st}$ insulating film 106. For instance, the film thickness of the $1^{st}$ insulating film 106 is formed to be about 1 μm to about 3 μm, and the film thickness of the $2^{nd}$ insulating film 109 is formed to be about 2 μm to about 10 μm. This is for preventing the formation of a large capacity between the lower electrode of the semiconductor conversion element made of the $4^{th}$ metal layer 108 and the signal wiring made of the $3^{rd}$ metal layer 107 arranged just below the lower electrode because the area of the lower electrode is large. Therefore, the capacity formed between both the signal wiring and the lower electrode can be reduced by thickening the film thickness of the $2^{nd}$ insulating film 109 arranged between the signal wiring and the lower electrode. Moreover, the reason why the film thickness of the $1^{st}$ insulating film 106 is made to be thin is that the area of the part where the signal wiring and the gate wiring (not shown) connected to the gate electrode made of the $1^{st}$ metal layer overlap with each other is extremely smaller than the area of the part where the signal wiring overlaps with the lower electrode as shown in FIG. 1.

Because the capacity can be surely decreased by thickening the film thickness even if the area is small, properly speaking, the thicker the film thickness of the $1^{st}$ insulating film 106 is, the better the capacity is. However, when the film thicknesses of both the $1^{st}$ insulating film 106 and the $2^{nd}$ insulating film 109 are formed to be 10 µm for instance, the step of the pattern between the region in which both the insulating films are arranged and the region in which both the insulating films are not arranged becomes up to 20 µm. As a result, when the semiconductor conversion elements are formed by using the photolithographic method after the formation of the insulating films 106 and 109, the pattern residue is generated in the boundary part where the insulating films 106 and 109 are patterned. For instance, an electroconductive film such as the bias wiring made of a $5^{th}$ metal layer, the upper electrode of the semiconductor conversion element made of the transparent electrode layer 13, and the like remains, and consequently a short circuit is formed between the wiring, and it becomes impossible to stably manufacture the radiation detecting apparatus.

Accordingly, the present embodiment thins the film thickness of the $1^{st}$ insulating film 106 arranged between the gate wiring and the signal wiring, which form low capacities, in order to reduce the step at the boundary of the region in which the insulating films 106 and 109 are arranged and the region in which the insulating films 106 and 109 are not arranged. Hereupon, it is more preferable to form the $1^{st}$ insulating film 106 and the $2^{nd}$ insulating film 109 to be light blocking members such as a black resist, which does not transmit the visible light.

Figure 15:
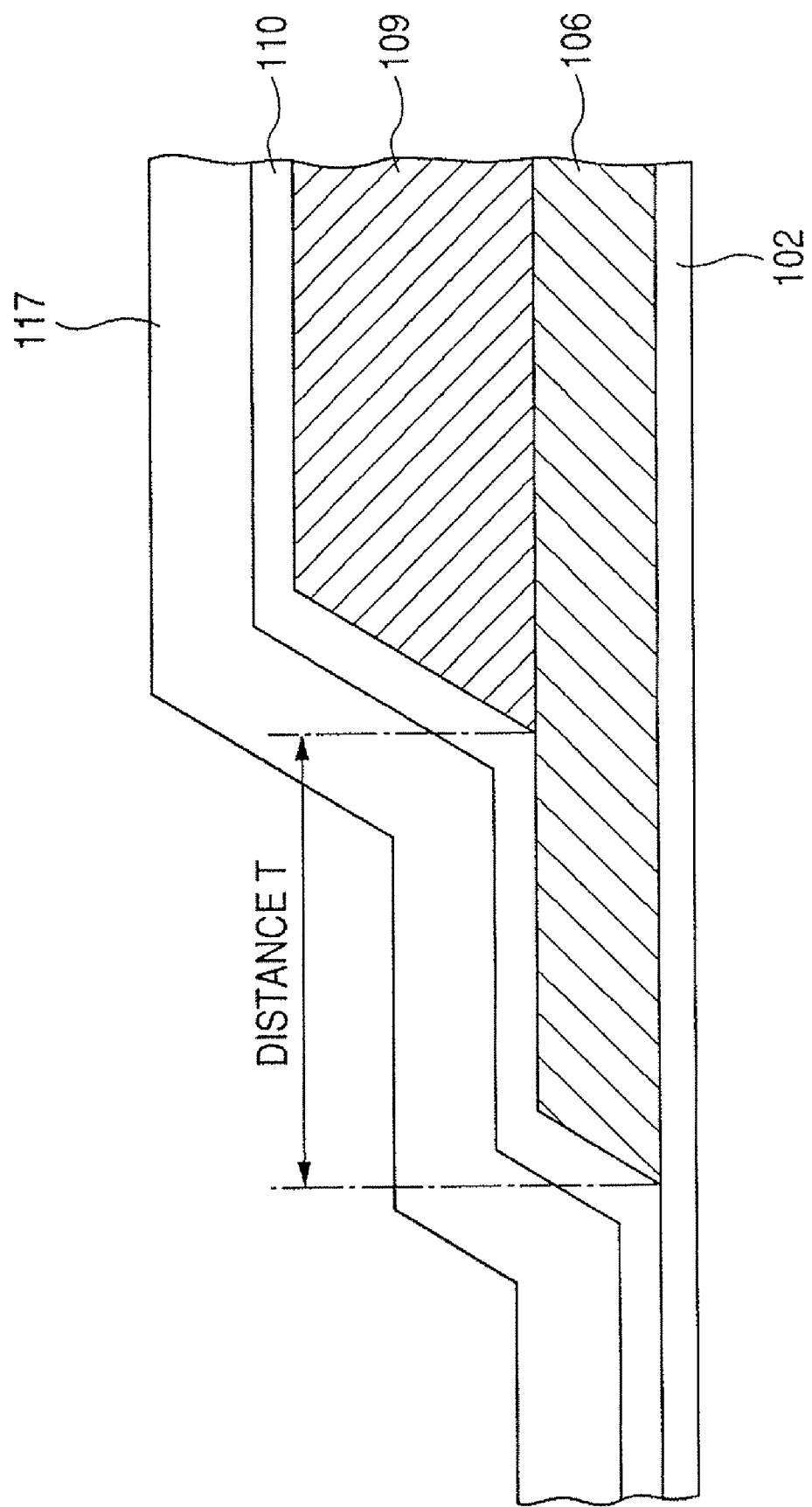
FIG. 15 is a sectional view showing a boundary part of a region where a $1^{st}$ and a $2^{nd}$ insulating films shown in FIG. 14 are arranged and a region where they are not arranged.

FIG. 15 is a sectional view showing the boundary part of the region where the $1^{st}$ insulating film 106 and the $2^{nd}$ insulating film 109 in FIG. 14 are arranged and the region where they are not arranged.

The boundary position of the end of each of the plurality of insulating films 106 and 109 is different from each other, and the total film thickness stepwise changes. That is, the position of the boundary of the region in which each of the insulating films 106 and 106 is arranged and the region in which each of the insulating films 106 and 109 is not arranged is different between the region in which all of the plurality of insulating films 106 and 109 are arranged and the region in which any of the insulating films 106 and 109 are not arranged.

As described above, the radiation imaging apparatus can be stably manufactured by thinning the film thickness of the insulating film in the region where the capacity is formed to be small. However, it is necessary to perform the patterning of the $1^{st}$ insulating film 106 and the $2^{nd}$ insulating film 109 shown in FIG. 14 at different positions to avoid having a step at a position in order to stabilize the manufacturing process more. Accordingly, as shown in FIG. 15, by shifting the patterning positions of the $1^{st}$ insulating film 106 and the $2^{nd}$ insulating film 109 to change the total film thickness in a staircase pattern, the manufacturing process can be stabilized more. The distance T between the ends of the insulating films 106 and 109 shown in the view is preferably at least the film thickness or more of the $2^{nd}$ insulating film 109. Moreover, the $2^{nd}$ insulating film 109 may be formed to cover the end of the pattern of the $1^{st}$ insulating film 106 in FIG. 15. In this case, at the time of patterning using the photolithographic method, the $2^{nd}$ insulating layer 109 is easily influenced by the film thickness of the $1^{st}$ insulating film 106, and accordingly the distance T between the ends of the insulating films 106 and 109 is preferably at least the film thickness of the $1^{st}$ insulating film 106 or more.

Fifth Embodiment

First a fifth embodiment of the present invention is described.

Figure 16:
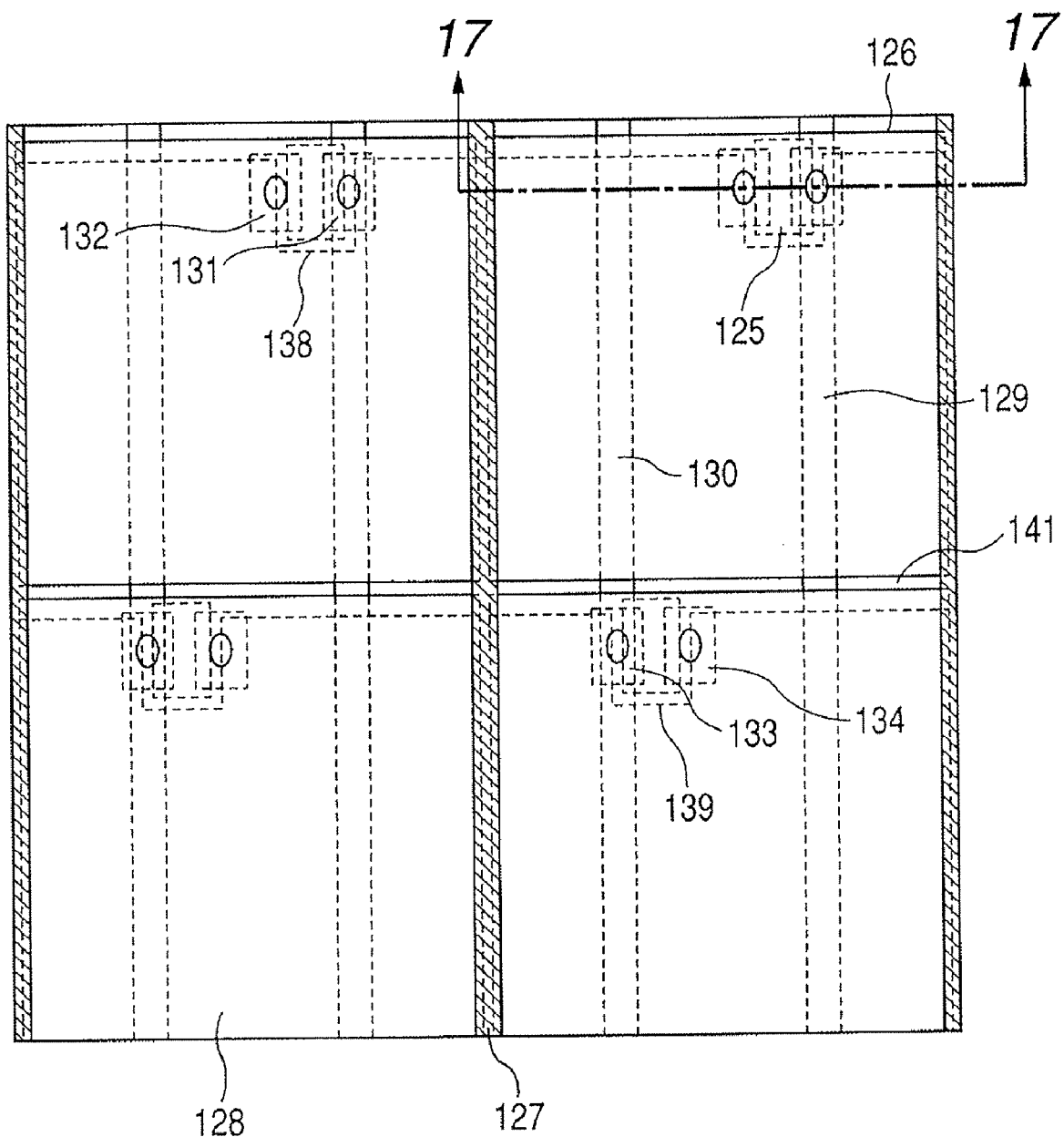
FIG. 16 is a plan view of pixels of a radiation detecting apparatus according to a fifth embodiment of the present invention.
Figure 17:
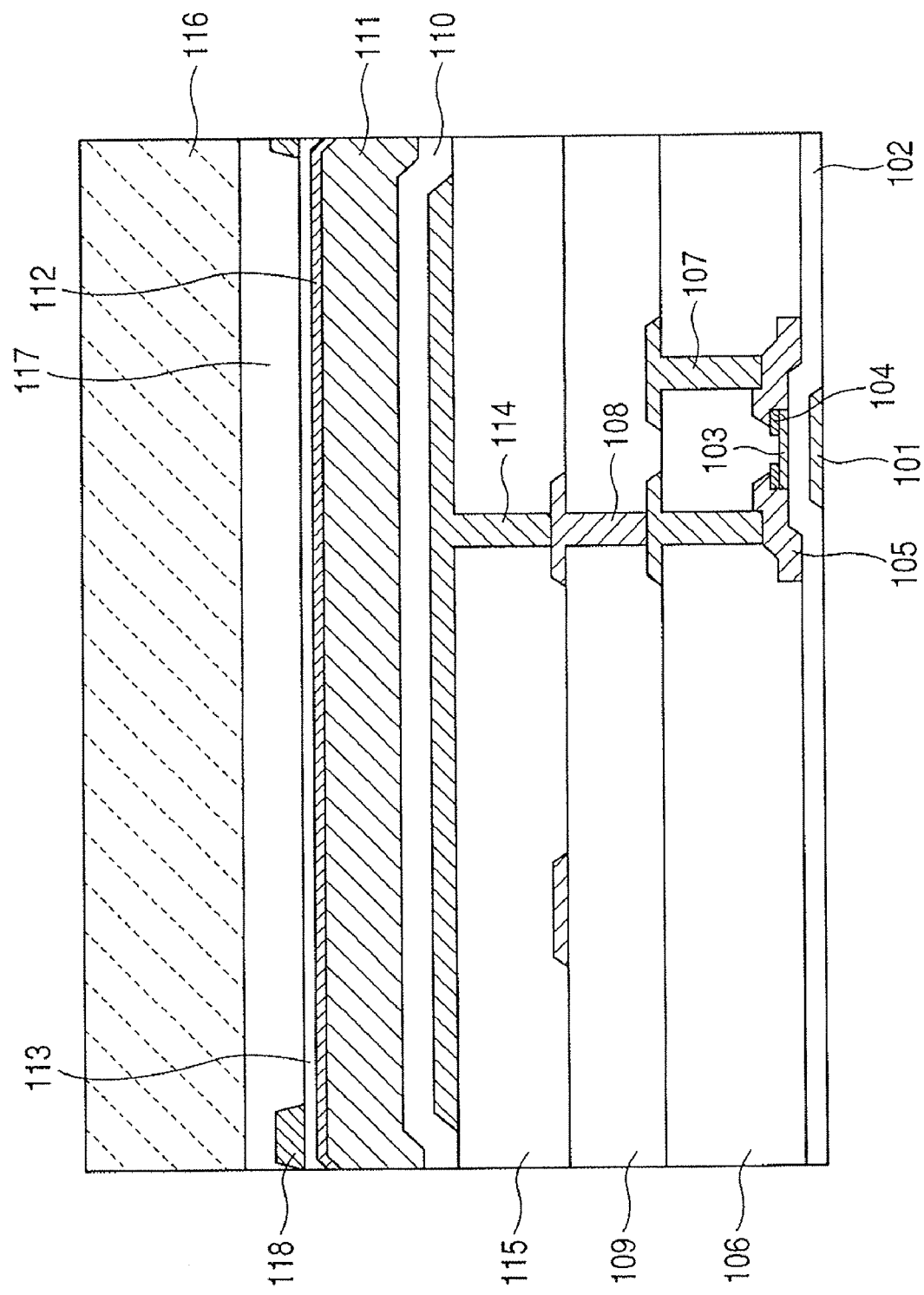
FIG. 17 is a sectional view taken along a line 17-17 in FIG. 16.

FIGS. 16 and 17 are a plan view and a sectional view of the pixels of the radiation detecting apparatus of the fifth embodiment according to the present invention.

The gist of the present embodiment is that the plurality of the insulating films are 3 or more, and that two or more regions put between the insulating films exist, and further that each wiring is formed of a metal layer different from each other.

FIG. 16 is a plan view of the pixels of the radiation detecting apparatus according to the fifth embodiment of the present invention. FIG. 16 is a plan layout view showing a pixel part composed of two rows by two columns of the effective pixel region where the pixels including conversion elements, severally converting a radiation or a light into an electric signal, and switching elements, which are severally coupled with each of the conversion elements, are arranged in a matrix on an insulating substrate.

The present embodiment is different from the embodiment shown in FIG. 4 in that the $1^{st}$ signal wiring 129 and the $2^{nd}$ signal wiring 130 are formed of metal layers different from each other, and that both of the wiring 129 and 130 are formed of the metal layers each put between insulating films located between the TFT portions and the semiconductor conversion element portions.

FIG. 17 is a sectional view taken along a line 17-17 in FIG. 16, and shows an example of the case of forming the signal wiring using the same metal layers of the source electrodes and the drain electrodes of the TFTs.

The description of the portions common to those shown in FIG. 5 is omitted.

The upper part shows a semiconductor conversion element and the lower part shows a TFT. The semiconductor conversion element in the upper part is an MIS type semiconductor conversion element composed of the $5^{th}$ metal layer 114, the insulating film 110 of the semiconductor conversion element, the $2^{nd}$ high resistance semiconductor layer 111, the $2^{nd}$ impurity semiconductor layer 112, which is an ohmic contact layer, and the transparent electrode layer 113. The light such as a visible light can be photoelectrically converted. $6^{th}$ metal layers 118 are the bias wiring for applying a voltage to the transparent electrode layer 113, and are connected with the common electrode driver arranged on the outside of the substrate.

The $1^{st}$ signal wiring 129 shown in FIG. 16 is formed of the $3^{rd}$ metal layer 107 in FIG. 17, and is arranged in the region put between the $1^{st}$ insulating film 106 and the $2^{nd}$ insulating film 109. Moreover, the $2^{nd}$ signal wiring 130 shown in FIG. 16 is formed of the $4^{th}$ metal layer 108 in FIG. 17, and is arranged in the region put between the $2^{nd}$ insulating film 109 and a $3^{rd}$ insulating film 115.

Hereupon, the $1^{st}$ insulating film 106, the $2^{nd}$ insulating film 109 and the $3^{rd}$ insulating film 115 severally use an insulating film made of an organic material. As for the organic material, the materials such as a polyimide resin, an acrylic resin and the like having a high resisting property are preferable, and also as for the relative dielectric constant, the constant is preferably a small one of from about 2.5 to 4. The film thickness of each of the insulating films 106, 109 and 115 made of the organic material is preferably 1 μm or more.

Thereby, even if the signal wiring is divided into to systems and the wires are arranged to be twice as many as the wires in an ordinal case as shown in FIG. 4, the enlargement of the capacity formed between the semiconductor conversion element arranged in the upper part and the signal wiring 129 and 130 can be prevented. Moreover, the degree of freedom of the drawing around of the wiring increases, and, for instance, also the capacity formed between the $1^{st}$ signal wiring 129 and the $2^{nd}$ signal wiring 130 can be reduced by changing the arranged positions to enable the provision of a low noise radiation imaging apparatus dealing with a high speed moving image. Furthermore, in the case where the widths of wires of the wiring are made to be thick to achieve to lower the resistance of the wiring, and in the case of the radiation detecting apparatus capable of taking a high-definition image having a pixel pitch of, for example, from 50 μm to 160 μm, the effect of reducing the capacity is large if the two pieces of the signal wiring are made of different metal layers from each other.

That is, the radiation detecting apparatus takes the configuration in which, when the number of wires increases, it becomes possible to arrange a plurality of protective films to selectively arrange the wiring in the protective films, and which can reduce the capacity of the wiring. Moreover, after the $1^{st}$ insulating film 106 and the $2^{nd}$ insulating film 109, which are made of an organic material, have been arranged, there is the case where the substrate does not pass a high temperature process of 300° C. or more for instance. In this case, the gate wiring may be arranged in the region put between the $1^{st}$ insulating film 106 and the $2^{nd}$ insulating film 109, and the signal wiring may be arranged in the region put between the $2^{nd}$ insulating film 109 and the $3^{rd}$ insulating film 115. In this case, aluminum, which has a small resistivity, is preferably used as the gate wiring.

Sixth Embodiment

First, description is given to a sixth embodiment of the present invention.

FIGS. 18 to 22 are simplified equivalent circuit diagrams of the radiation imaging apparatus of the sixth embodiment according to the present invention, and a plan view and a sectional view of pixels.

The gist of the present embodiment is that a plurality of wires of the signal wiring is formed to a plurality of pixels of one column, and that a plurality of consecutive pixels in one column is assigned to each wire of the signal wiring, and further that each wire of the signal wiring is connected with the thin film transistor of an assigned pixel.

Figure 18:
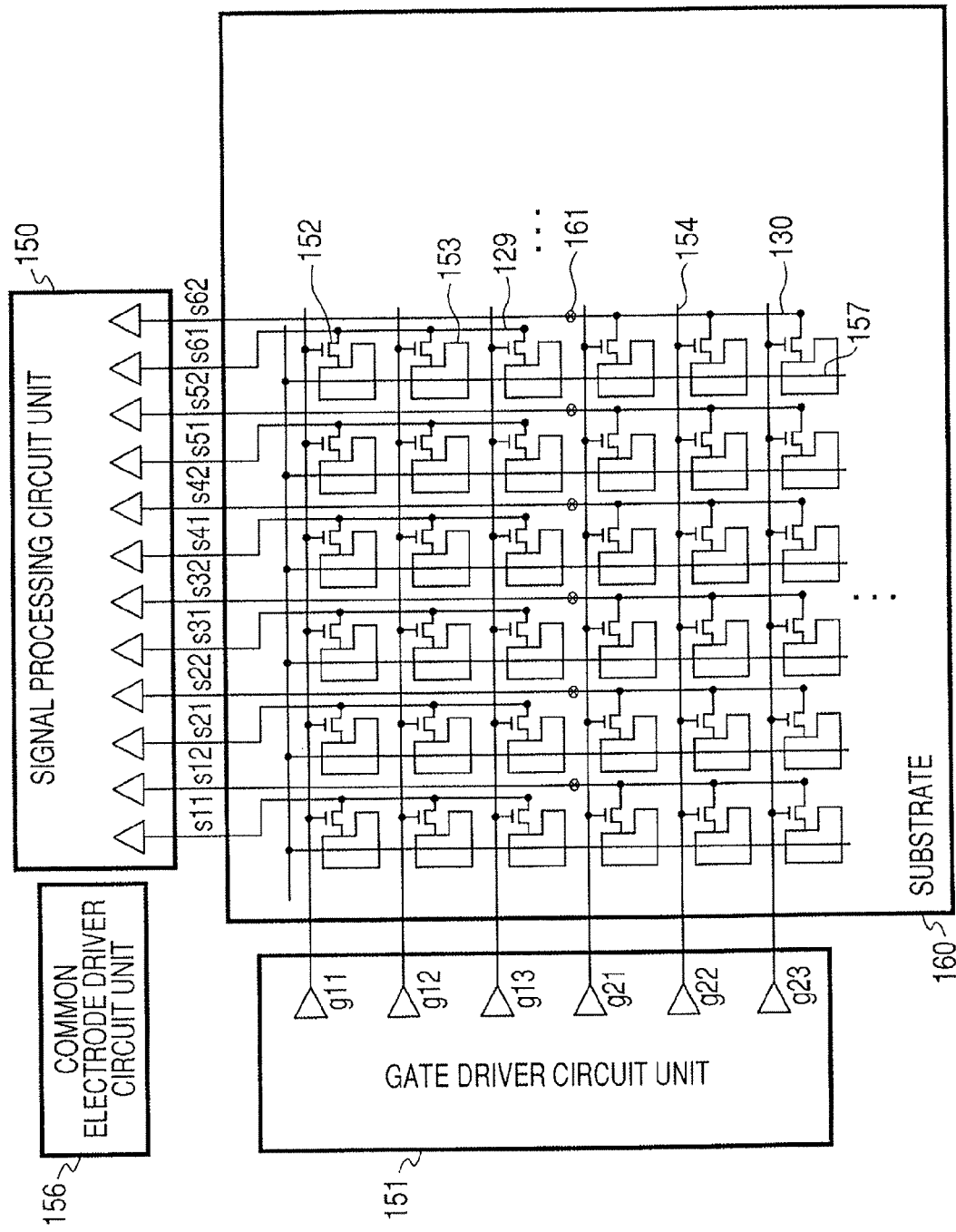
FIG. 18 is a simplified equivalent circuit diagram of a radiation imaging apparatus according to a sixth embodiment of the present invention.

FIG. 18 is a simplified equivalent circuit diagram of the radiation imaging apparatus according to the sixth embodiment of the present invention.

The pixel region is divided into two zones, and a $1^{st}$ signal wiring for reading image data from the zone of three rows by six columns in the upper part and a $2^{nd}$ signal wiring for reading image data from the zone of three rows by six columns in the lower part are separately arranged. Moreover, FIG. 18 shows the state controlled by the signal processing circuit unit and the gate driver circuit unit, which are arranged on the same side.

In the substrate 160, pixels, in each of which the TFT portion 152 and the semiconductor conversion element portion 153 are coupled with each other, are arranged in a matrix.

The gate wiring 154, the $1^{st}$ signal wiring 129 and the $2^{nd}$ signal wiring 130 are connected to the TFT portions 152, and the bias wiring 157 from the common electrode driver circuit unit 156 is connected with the semiconductor conversion element portions 153.

The sixth embodiment differs from the first embodiment shown in FIG. 3 in that the signal wiring is divided into the two portions of the $1^{st}$ signal wiring 129 and the $2^{nd}$ signal wiring 130. The $1^{st}$ signal wiring 129 is connected with the TFT portions 152 connected with the semiconductor conversion element portions 153 of three rows by six columns arranged in the upper part, and the $2^{nd}$ signal wiring 130 is connected with the TFT portions 152 connected with the semiconductor conversion element portions 153 of three rows by six columns arranged in the lower part. The $2^{nd}$ signal wiring 130 is connected with another metal layer through through-holes 161 arranged at the central part of the substrate, and is drawn around to the signal processing circuit unit 150 arranged on the outside of the substrate.

As a result, a signal from a semiconductor conversion element arranged in a zone far away from the signal processing circuit unit 150 can be transmitted to the signal processing circuit unit 150 arranged on one certain side of the substrate 160. At the same time, by the division of the signal wiring into the plurality of zones, for example, the number of the TFTs connected to one wire of the signal wiring and the number of the intersecting parts with the gate wiring can be decreased, and the total capacity of the signal wiring can be reduced. Moreover, by driving the gate wiring arranged in the zones in the upper part and in the lower part at the same time, a plurality of signals can be read at the same time, and it becomes possible to perform a high speed drive.

Figure 19:
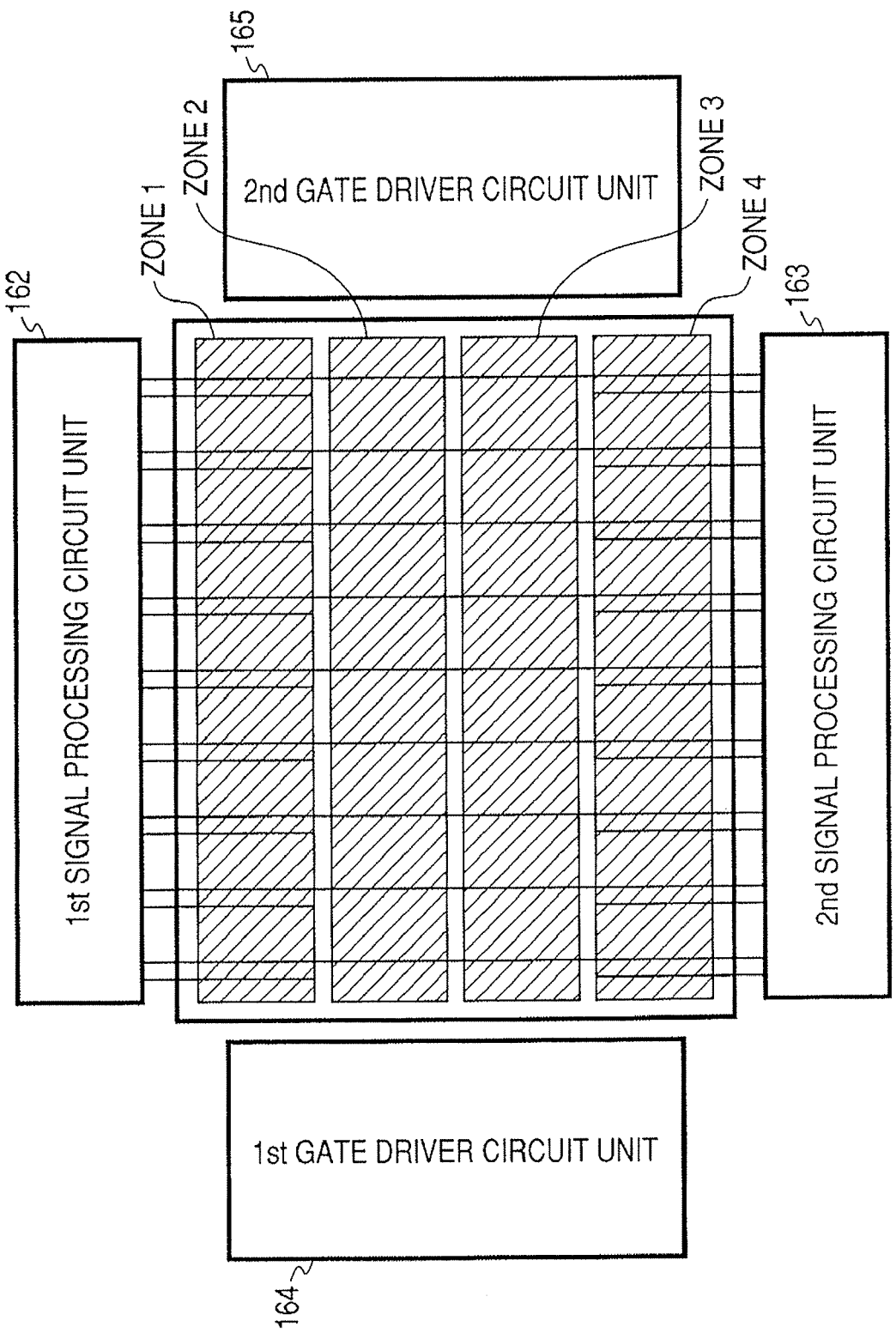
FIG. 19 is a conceptual diagram showing a relation between a pixel region on a substrate and peripheral circuitry of the radiation imaging apparatus according to the sixth embodiment of the present invention.

FIG. 19 is a conceptual diagram showing the relation between the pixel region in the substrate and the peripheral circuitry of the radiation imaging apparatus according to the sixth embodiment of the present invention.

FIG. 19 shows a connection state of a region in which the semiconductor conversion elements are arranged in the substrate with signal processing circuit units and gate driver circuit units, which are arranged in the surrounding. FIG. 19 shows an arrangement example showing another configuration of the radiation detecting apparatus in which the semiconductor conversion elements are divided into a plurality of zones and dedicated signal wiring is arranged to each zone as shown in FIG. 18.

In FIG. 19, the semiconductor conversion elements arranged in the substrate are divided into four zones of zones 1-4, and dedicated signal wiring is arranged to each zone. A $1^{st}$ signal processing circuit unit 162 capable of taking in signals form the two zones in the upper part and a $2^{nd}$ signal processing circuit unit 163 capable of taking in signals form the two zones in the lower part are arranged on the outside of the substrate. Furthermore, a $1^{st}$ gate driver circuit unit 164 and a $2^{nd}$ gate driver circuit unit 165 that control the gate electrodes arranged in each zone are arranged. Although it is not shown in the diagram, a common electrode driver circuit unit or a power source for applying a voltage to the semiconductor conversion elements is arranged in the signal processing circuit units 162 or 163, or the gate driver circuit units 164 or 165, mentioned above.

By diving the pixel region into four roughly, the number of the TFTs connected with one wire of the signal wiring can be reduced to ¼. As a result, the capacities formed between the source electrodes and the gate electrodes of the TFT portions are reduced especially, and consequently the total capacity of the signal wiring can be reduced. At this time, the formed capacity of the wiring drawn around from the zone 2 to the $1^{st}$ signal processing circuit 162, for instance, can be reduced by putting organic materials, which are insulating films, at the upper part and the lower part of the wiring in at least a position passing through the zone 1 even when, for example, the semiconductor conversion elements are arranged above the wiring. Consequently, it is possible to suppress the total capacity of the signal wiring to be small while securing the aperture ratios of the semiconductor conversion elements to be large. Moreover, by driving four wires of the gate wiring, each one selected from each zone, simultaneously to transmit signals to the signal processing circuits at the same time, it is also possible to perform a high speed drive.

As for the gate wiring, the first gate driver circuit unit 164 and the second gate driver circuit unit 165 may be connected with each other with the gate wiring arranged in the substrate, or may be separated from each other at the center to the left side and to the right side.

Figure 20:
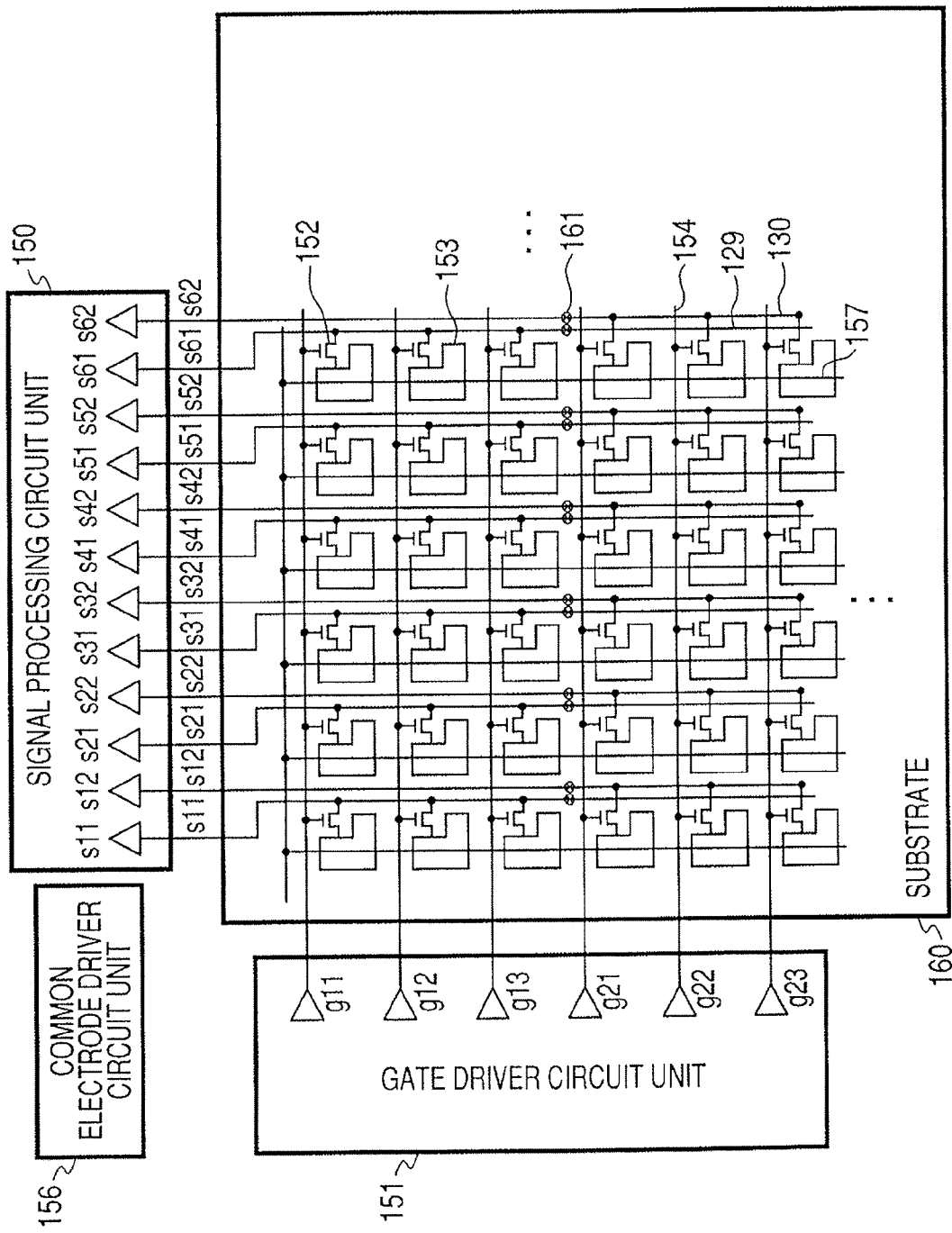
FIG. 20 is another simplified equivalent circuit diagram of the radiation detecting apparatus according to the sixth embodiment of the present invention, which diagram is different from one shown in FIG. 13.

FIG. 20 is a simplified equivalent circuit diagram of a radiation imaging apparatus according to the sixth embodiment of the present invention, and is a diagram showing another example different from the example shown in FIG. 18.

The example is different from the one shown in FIG. 18 in that the $1^{st}$ signal wiring 129 is extended to the zone of thee rows by six columns in the lower part, in which the $1^{st}$ signal wiring 129 is not connected with the TFTs. This is because of making the time constants and the total capacities of the $1^{st}$ signal wiring 129 and the $2^{nd}$ signal wiring 130 be the same as much as possible. By adopting the configuration of putting the organic materials on and below, the capacity formation with the surrounding can be suppressed to be small, but the capacity formation cannot be completely removed. Consequently, when the length of wiring changes or the number of intersections changes, the total capacity related to the wiring changes. The difference of the total capacity changes the time constant of the wiring and the wiring noises, and the image information from the semiconductor conversion elements has different character in each zone.

Hereupon, the configuration is preferable in which the $1^{st}$ signal wiring 129 reading signals from the upper zone is put between organic materials, which are difficult to be influenced by the surrounding and form little capacities, in the lower part from the through-holes 161 at the central part. Moreover, the configuration is adopted in which the $2^{nd}$ signal wiring 130 reading signals from the lower zone is put between the organic materials, which are difficult to be influenced by the surrounding and form little capacities and further is the same one as the one used for the $1^{st}$ signal wiring 129 in the lower zone, in the upper part from the through-holes 161 at the central part. That is, the metal layers of the $1^{st}$ signal wiring 129 and the $2^{nd}$ signal wiring 130 switch their positions in the upper and the lower zones of the through-holes 161 as the boundary.

As a result, the total capacities of the $1^{st}$ signal wiring 129 and the $2^{nd}$ signal wiring 130 become equal to each other, and for example, the time constant of the wiring and wiring noises can be equal in each zone. Consequently, when a radiation is made to an image, a sense of incompatibility of images to be different in property in each zone, and the like can be avoided.

Figure 21:
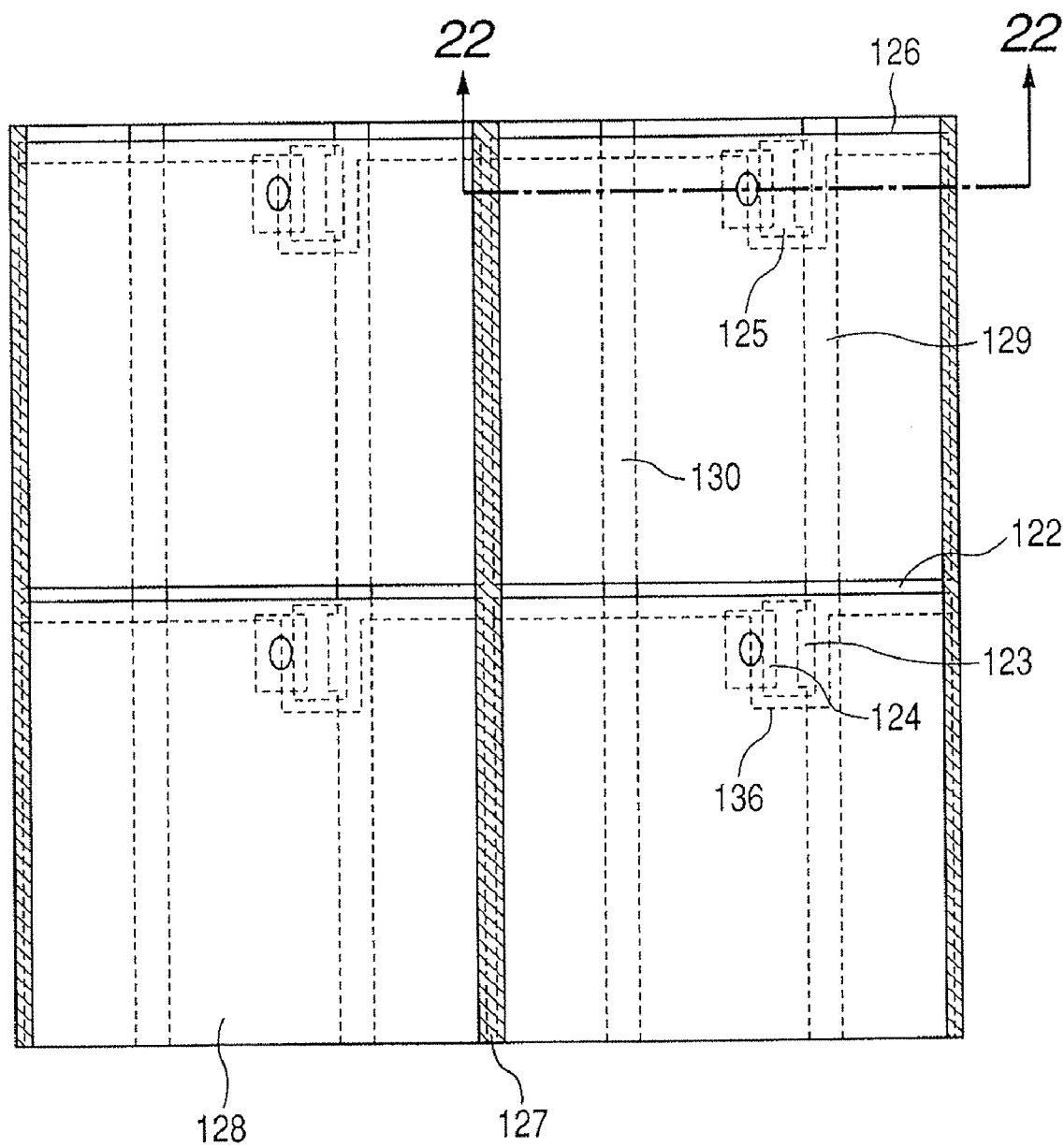
FIG. 21 is a plan view of pixels of a radiation detecting apparatus according to the sixth embodiment of the present invention.

FIG. 21 is a plan view of pixels of a radiation detecting apparatus according to the sixth embodiment of the present invention.

FIG. 21 is a play layout view showing a pixel part of 2 rows by 2 columns of the effective pixel region, in which the pixels, in each of which a semiconductor conversion element converting an radiation into an electric signal and a TFT are coupled with each other, are arranged in a matrix.

All of the source electrodes 123 of the four TFTs arranged in the zone of the two rows by two columns are connected with the $1^{st}$ signal wiring 129, and the $2^{nd}$ signal wiring 130 is connected with the source electrodes of the TFTs arranged in other zones. Here, the $1^{st}$ signal wiring 129 are formed at the same time when the formation of the source electrodes 123. The $2^{nd}$ signal wiring 130, which is not connected with the TFTs in the zones shown in FIG. 21, is formed using a different metal layer arranged above the $1^{st}$ signal wiring 129.

FIG. 22 is a sectional view taken along a line 22-22 in FIG. 21, and shows an example of the case where the signal wiring is formed using the same metal layers as those of the source electrode and the drain electrode of a TFT.

The description relative to the portions common to the ones shown in FIG. 5 is omitted.

The upper part shows a semiconductor conversion element, and the lower part shows the TFT. The semiconductor conversion element in the upper part is an MIS type semiconductor conversion element composed of the $4^{th}$ metal layer 108, the insulating film 110 of the semiconductor conversion element, the $2^{nd}$ high resistance semiconductor layer 111, the $2^{nd}$ impurity semiconductor layer 112, which is an ohmic contact layer, and the transparent electrode layer 113. The semiconductor conversion element can perform the photoelectric conversion of a light such as visible light. The $5^{th}$ metal layers 114 are bias wiring for applying a voltage to the transparent electrode layer 113, and is connected with a common electrode driver circuit unit arranged on the outside of the substrate.

The $1^{st}$ signal wiring 129 shown in FIG. 21 is formed of the second metal layer 105 in FIG. 22, and is arranged in the region put between an insulating film 102 of the gate and the $1^{st}$ insulating film 106. The $2^{nd}$ signal wiring 130 is formed of the $3^{rd}$ metal layer 107 in FIG. 22, and is arranged in the region put between the $1^{st}$ insulating film 106 and the $2^{nd}$ insulating film 109. As shown in the simplified equivalent circuit diagram of FIG. 20, the wires of the $1^{st}$ signal wiring 129 and the $2^{nd}$ signal wiring 130 are extended to be arranged in order to make the capacities of the $1^{st}$ signal wiring 129 and the $2^{nd}$ signal wiring 130 be the same. In this case, the second signal wiring 130 is connected with the source electrodes of the TFTs of the pixels in the regions other than those shown in FIG. 21, and is formed of the second metal layer 105. And, in the regions shown in FIG. 21, the $2^{nd}$ signal wiring 130 is not connected with the TFTs, and is formed of the $3^{rd}$ metal layer 107.

Seventh Embodiment

A seventh embodiment provides a radiation detecting apparatus dealing with a moving image and including two transistors per pixel for enabling a high speed drive. The gist of the present embodiment is that pixels, each including one semiconductor conversion element and two TFTs coupled with the semiconductor conversion element, are two-dimensionally arranged, in which, for example, the TFTs are used in a way in which one TFT aims electric carrier transfer and the other TFT aims retting. The present embodiment is configured to take in an image at a high speed and to be able to be reset. It is preferable to use polysilicon capable of a high speed transfer as the material of the TFTs because the electric carrier transfer and the resetting of electric carriers can be performed instantaneously. At this time, in the case where the gate wiring of the TFTs is made of a refractory metal such as chromium, titanium, tantalum or the like, the wiring resistance is high. Consequently, when the wiring width is made to be thick, the wiring capacity becomes large. Accordingly, the gate wiring is arranged above the TFT with an insulating film put between the gate wiring and the TFT, and thereby materials having a small resistivity such as aluminum, copper and the like can be used. At this time, the signal wiring connected with the source electrodes or the drain electrodes of the TFT portions, or the reset wiring is also arranged above the gate wiring with the insulating film between them. Furthermore, the semiconductor conversion elements are arranged above these pieces of wiring with an insulating film between them. That is, the gate electrodes, the source electrodes and the drain electrodes of the TFT portions are formed. After that, the insulating film is formed. After that, one of the pieces of the gate wiring and the signal wiring is formed, and further the other piece of the gate wiring and the signal wiring is formed after the insulating film has been formed. Then, the semiconductor conversion elements are arranged after the insulating film has been again formed, and thereby the wiring resistance and the wiring capacity can be reduced. Consequently, a low noise radiation imaging apparatus capable of being driven at a high speed can be provided. Hereupon, the insulating film having a low dielectric constant and a thick film thickness is preferable for the three insulating films. For instance, in case of using an organic insulation film is used, the capacities between each of the TFT portions, the gate wiring, the signal wiring, the reset wiring and the semiconductor conversion elements can be reduced, and a radiation imaging apparatus having further lower noises and capable of being driven at a high speed can be provided.

Eight Embodiment

Next, description is given to an eighth embodiment of the present invention.

Figure 25:
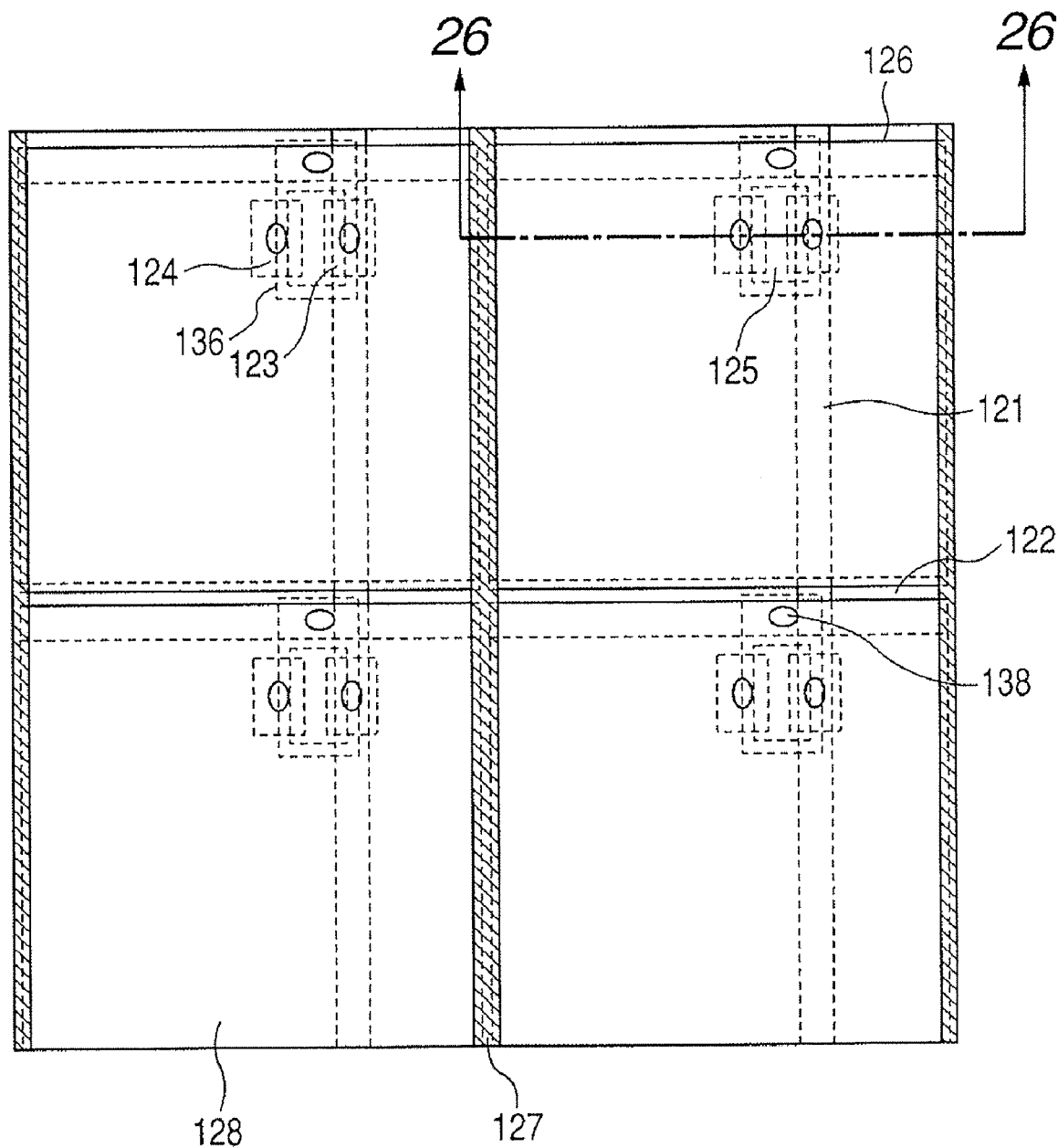
FIG. 25 is a plan view showing pixels of a radiation detecting apparatus according to an eighth embodiment of the present invention.
Figure 26:
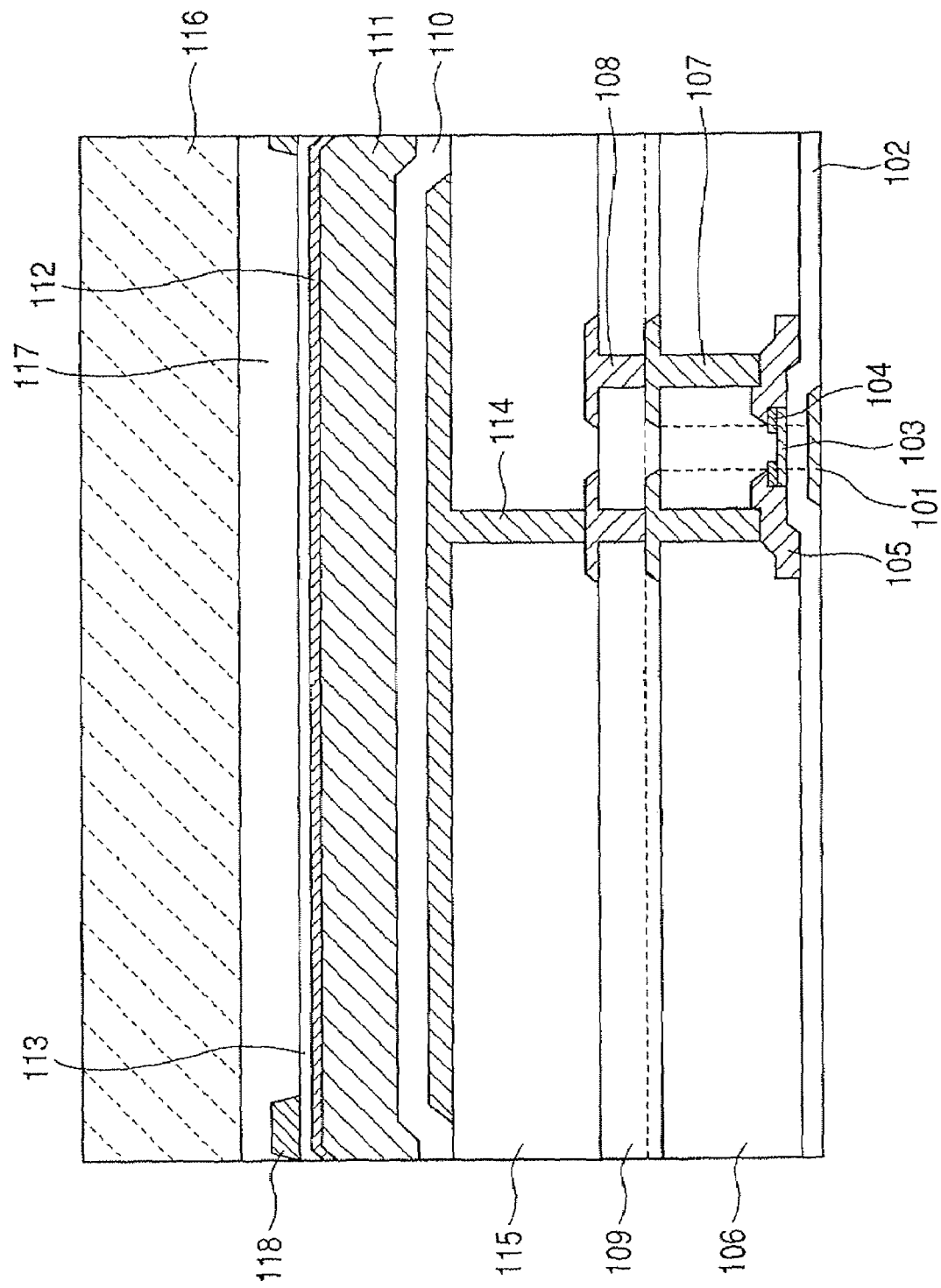
FIG. 26 is a sectional view taken along a line 26-26 in FIG. 25.

FIGS. 25 and 26 are a plan view of pixels of a radiation detecting apparatus of an eighth embodiment according to the present invention, and a sectional view thereof, respectively.

The gist of the present embodiment is that the number of a plurality of insulating films is three or more, and that the number of the regions each put between insulating films is two or more, and further that each wiring is formed of a different metal layer.

FIG. 25 is a plan view of the pixels of the radiation detecting apparatus according to the eighth embodiment of the present invention.

FIG. 25 is a plan layout view showing a pixel part composed of two rows by two columns of the effective pixel region including pixels, each of which includes a conversion element converting an radiation into an electric signal and a switching element coupled with the conversion element, are arranged in a matrix over an insulating substrate.

The present embodiment differs from the embodiment shown in FIG. 1 in that the gate electrode 136 and the gate wiring 122 are formed in different metal layers and are connected with each other in each pixel through through-holes 138.

FIG. 26 is a sectional view taken along a line 26-26 in FIG. 25. The upper part shows a semiconductor conversion element, and the lower part show a TFT. FIG. 26 shows an example of the case where signal wiring is formed by using the same metal layer as the source electrode and the drain electrode of the TFT.

The semiconductor conversion element in the upper part is an MIS type semiconductor conversion element composed of the $5^{th}$ metal layer 114, the $2^{nd}$ insulating film 110, the $2^{nd}$ high resistance semiconductor layer 111, the $2^{nd}$ impurity semiconductor layer 112, which is an ohmic contact layer, and the transparent electrode layer 113. The semiconductor conversion element can perform the photoelectric conversion of a light such as a visible light. The $6^{th}$ metal layers 118 are bias wiring for applying a voltage to the transparent electrode layer 113, and are connected with the common electrode driver arranged on the outside of the substrate.

The signal wiring 121 shown in FIG. 25 is formed of the $4^{th}$ metal layer 108 in FIG. 26, and is arranged in the region put between the $2^{nd}$ insulating film 109 and the $3^{rd}$ insulating film 115. Moreover, the gate electrode 136 shown in FIG. 25 is formed of the $1^{st}$ metal layer 101 in FIG. 26, and the gate wiring 122 is formed of the $3^{rd}$ metal layer 107 (a dotted line portion shown in the $2^{nd}$ insulating film 109 in the view). Moreover, the gate electrode 136 and the gate wiring 122 are connected through a through-hole (a dotted line portion shown in the $1^{st}$ insulating film 106 in the diagram). Hereupon, the $1^{st}$ insulating film 106, the $2^{nd}$ insulating film 109 and the $3^{rd}$ insulating film 115 severally use an insulating film made of an organic material. As for the organic material, a material having a high heat resisting property, such as the polyimide resin, the acrylic resin or the like, and having a small relative dielectric constant within a range of from about 2.5 to about 4 is preferable. Such a configuration is preferable, for instance, in the case where the insulating film 102 of the gate, which is the insulating film of the TFT portion, is formed of a high-temperature inorganic material formed at, for example, a temperature within a range of from 300° C. to 350° C. to form a TFT having a high reliability while the gate wiring is formed of aluminum wiring having a low resistivity.

Here, it is assumed that the film thickness and the relative dielectric constant of the $1^{st}$ insulating film 106 are T1 and $\epsilon 1$, respectively, and that the film thickness and the relative dielectric constant of the $2^{nd}$ insulating film 109 are T2 and $\epsilon 2$, respectively, and further that the film thickness and the relative dielectric constant of the $3^{rd}$ insulating film 115 are T3 and $\epsilon 3$, respectively. As it is known from FIG. 25, the maximum area among the areas of intersecting portions of the electroconductive metal films is the one between the gate wiring 122 and the lower electrode 126 (area S1), and the next one is the one between the signal wiring 121 and the lower electrode 126 (area S2), and then the last one is the one between the signal wiring 121 and the gate wiring 122 (area S3). That is, the capacities C1, C2 and C3 per unit area formed by each intersecting part are designed so that, when the relation of S1>S2>S3 is true, a relation of C1<C2<C3 may be true.

When the film thicknesses and the relative dielectric constants of the insulating films are designed in the manner mentioned above, it becomes possible to suppress the capacities formed by metal layers to be small while the film thicknesses of the insulating films are formed to be as thin as possible.

In the above, the first to the eighth embodiments of the present invention have been described. In the following, description is given to a packaging example of a radiation imaging apparatus using an radiation detecting apparatus of the present invention, and an application example of the radiation imaging apparatus to a radiation imaging system.

Figure 23A:
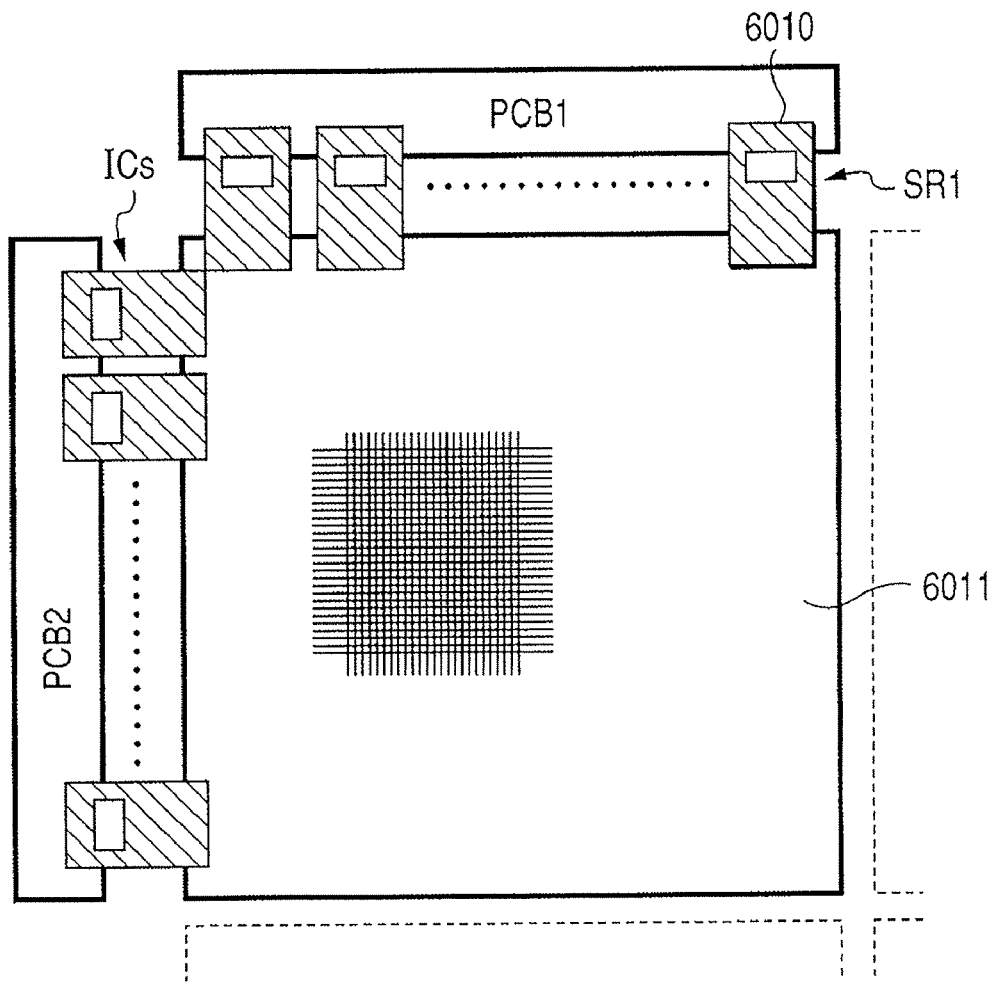
FIGS. 23A and 23B are schematic conFIGuration diagrams showing a packaging example of an (X-ray) radiation imaging apparatus according to the present invention, FIG. 23A being a plan view, FIG. 23B being a sectional view.
Figure 23B:
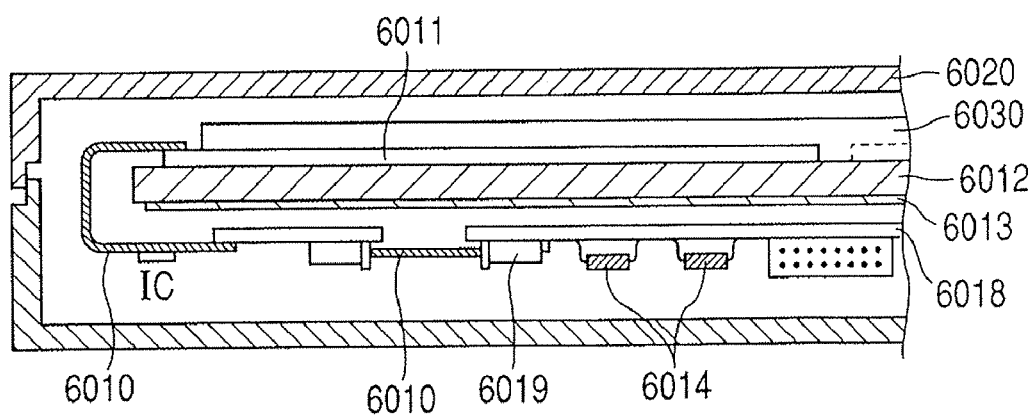

FIGS. 23A and 23B are schematic configuration diagrams showing a packaging example of an radiation imaging apparatus using an radiation detecting apparatus (X-ray detecting apparatus) of the present invention. FIG. 23A is a plan view, and FIG. 23B is a sectional view.

A plurality of semiconductor conversion elements, which are photoelectric conversion elements, and a plurality of TFTs are formed on a sensor substrate 6011, and a flexible circuit substrate 6010, on which shift registers SR1 and detection integrated circuits IC are mounted, is connected. The opposite side of the flexible circuit substrate 6010 is connected with circuit substrates PCB1 and PCB2. A plurality of the sensor substrates 6011 is adhered on a base 6012 to constitute a large-sized converting device. A lead plate 6013 for protecting memories 6014 and a circuit element 6019 in a processing circuit 6018 from an X-ray is mounted below the base 6012. A scintillator (phosphor layer) 6030 for converting an X-ray into a visible light, for instance, CsI is evaporated on the sensor substrate 6011. The whole is housed in a case 6020 made of carbon fiber as shown in FIG. 23B.

FIG. 24 is a view showing an application example of a radiation imaging apparatus using the radiation detecting apparatus of the present invention to a radiation imaging system.

An X-ray 6060 which has generated by an X-ray tube 6050 transmits the chest 6062 of a patient or a subject 6061 to enter a radiation imaging apparatus 6040 mounting the scintillator (phosphor layer) thereon. The information of the inside of the body of the patient 6061 is included in the entered X-ray. The scintillator emits light in correspondence to the entering of the X-ray, and the light is photoelectrically converted to be acquired as electric information. The information is converted into digital information, and the image processing of the digital information is performed by an image processor 6070, which is signal processing means. The processed information can be observed on a display 6080, which is installed in a control room and is display means.

Moreover, the information can be transferred to a remote place with transmitting and processing means such as a telephone line 6090. The information can be displayed on a display 6081, which is display means in another place such as a doctor room, and can be preserved in recording means such as an optical disk. Thereby, a doctor at the remote place can perform a diagnosis. Moreover, the information can be recorded on a film, which is a recording medium, with a film processor 6100, which is recording means.

As many apparently widely different embodiments of the present invention can be made without departing from the spirit and scope thereof, it is to be understood that the invention is not limited to the specific embodiments thereof except as defined in the claims.

The present invention can be applied to a radiation detecting apparatus of an X-ray for a medical use or a nondestructive inspection. Moreover, the present invention can be applied to an radiation detecting apparatus converting a light such as a visible light and the like, in particular to an radiation detecting apparatus including a large-area photoelectric conversion region.

This application claims the benefit of Japanese Patent Application Nos. 2005-251610 filed Aug. 31, 2005 and 2005-251609 filed Aug. 31, 2005, and 2006-227986 filed Aug. 24, 2006, which are hereby incorporated by reference herein in its entirety.

What is claimed is:

1. A radiation detecting apparatus comprising:
pixels including switching elements arranged on an insulating substrate and conversion elements arranged above said switching elements to convert a radiation into electric carriers, wherein each switching element has first and second electrodes and a gate electrode, the conversion element has first and second electrodes, said switching elements and said conversion elements are connected with each other, and said pixels are arranged two-dimensionally on said insulating substrate in a matrix;
gate wiring commonly connected with each of said switching elements arranged in a first direction on said insulating substrate;
signal wiring commonly connected with each of said switching elements arranged in a direction different from the first direction; and
a plurality of insulating films arranged between said switching elements and said conversion elements, wherein at least one of said gate wiring and said signal wiring is arranged to be put between said plurality of insulating films.

2. The radiation detecting apparatus according correspondingly to claim 1, wherein a plurality of wires of said signal wiring is arranged to said plurality of switching elements in the direction opposite to the first direction, and almost the same number of said switching elements is connected with each of said plurality of wires of said signal wiring on one column.

3. The radiation detecting apparatus according to claim 2, wherein almost the same number of said switching elements are said switching elements in regions divided in each of a plurality of pixels consecutive in the direction opposite to the first direction.

4. A radiation imaging apparatus comprising: a radiation detecting apparatus according to claim 3, further comprising a signal processing circuit connected to said signal wiring, wherein
said signal wiring is arranged up to positions of said pixels including said switching elements, said pixels most distantly connected from said signal processing circuit at the positions.

5. The radiation detecting apparatus according to claim 1, wherein said switching elements are transfer switching elements of the electric carriers generated based on the conversion of the radiation by said conversion elements, one electrode of said transfer switching element is connected to said signal wiring, said other electrode of said transfer switching element is connected to said conversion element, and said gate electrode is connected to a first gate wiring, and
said radiation detecting apparatus further comprising:
reset switching elements connected to said conversion elements, wherein a plurality of said reset switching elements in the direction opposite to the first direction are commonly connected with a second gate wiring, one electrode of said reset switching element is connected to a reset wiring, another electrode of the reset switching element is connected to said conversion element, and a gate electrode is connected to a second gate wiring; and
a reset wiring commonly connected with said plurality of reset switching elements in a first direction or a direction opposite to the first direction.

6. The radiation detecting apparatus according to claim 1, wherein said plurality of insulating films is composed of three layers or more, and each of said wirings is made of a metal layer arranged between said different insulating films.

7. The radiation detecting apparatus according to claim 6, wherein said gate wiring, said signal wiring and electrodes of said conversion elements two-dimensionally intersect with one another with said insulating films put between them, said insulating films formed to be thicker as intersecting areas become larger.

8. The radiation detecting apparatus according to claim 7, wherein said plurality of insulating films are formed to have a film thickness in consideration of a relative dielectric constant of a material.

9. The radiation detecting apparatus according to claim 1, further comprising a signal processing circuit connected with said signal wiring, wherein
the whole signal wiring is uniformly arranged up to positions of said pixels including said switching elements, said pixels most distantly connected from said signal processing circuit at the positions.

10. The radiation detecting apparatus according to claim 1, wherein the film thicknesses of said plurality of insulating films differs from one another.

11. The radiation detecting apparatus according to claim 1, wherein a boundary position of an end of each of said plurality of insulating films differs from each other, and a total film thickness stepwise changes.

12. The radiation detecting apparatus according to claim 1, further comprising a wavelength converting layer converting the radiation into the light in a wavelength region in which photoelectric conversion can be performed, wherein said conversion elements are elements converting the light into an electric signal.

13. The radiation detecting apparatus according to claim 1, wherein said conversion elements are elements converting the radiation into an electric signal directly.

14. A radiation imaging system comprising:
a radiation detecting apparatus according to claim 12 or 13;
signal processing means for processing a signal from said radiation detecting apparatus;
recording means for recording a signal from said signal processing means;
display means for displaying a signal from said signal processing means;
transmitting and processing means for transmitting a signal from said signal processing means; and
a radiation source for generating the radiation.

15. The radiation detecting apparatus according to claim 1, wherein each of said plurality of insulating films has a thickness of 1 μm-10 μm.

16. The radiation detecting apparatus according to claim 1, wherein each of said plurality of insulating films has a thickness of 2 μm-20 μm.

* * * * *